(12) United States Patent
Yilmaz et al.

(10) Patent No.: US 9,941,003 B2
(45) Date of Patent: Apr. 10, 2018

(54) MULTI-LEVEL RESISTIVE MEMORY STRUCTURE

(71) Applicant: THE REGENTS OF THE UNIVERSITY OF MICHIGAN, Ann Arbor, MI (US)

(72) Inventors: Yalcin Yilmaz, Ann Arbor, MI (US); Pinaki Mazumder, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/353,321

(22) Filed: Nov. 16, 2016

(65) Prior Publication Data

US 2017/0140815 A1    May 18, 2017

Related U.S. Application Data

(60) Provisional application No. 62/255,783, filed on Nov. 16, 2015.

(51) Int. Cl.
  *G11C 13/00*    (2006.01)
  *G11C 11/56*    (2006.01)

(52) U.S. Cl.
  CPC .......... *G11C 13/004* (2013.01); *G11C 11/56* (2013.01); *G11C 13/0026* (2013.01);
  (Continued)

(58) Field of Classification Search
  CPC . G11C 11/56; G11C 13/0026; G11C 13/0028; G11C 13/004; G11C 13/0069;
  (Continued)

(56) References Cited

U.S. PATENT DOCUMENTS 7,369,441 B2 * 5/2008 Huang ................ G11C 16/28
                                                         365/185.03
7,443,709 B2 * 10/2008 Ogiwara ............. G11C 5/147
                                                         365/145

(Continued)

FOREIGN PATENT DOCUMENTS

WO    WO2014100024 A1    6/2014
WO    WO2014113024 A1    7/2014
WO    WO2015065443 A1    5/2015

*Primary Examiner* — Vanthu Nguyen

(74) *Attorney, Agent, or Firm* — Reising Ethington P.C.

(57) ABSTRACT

A resistive memory structure comprises a resistive memory element, a resistance block electrically connected to the memory element through an electrical node, and an interpretation circuit electrically connected to the node and configured to interpret a voltage at the node and to indicate a resistive state of the memory element based on the voltage at the node. The interpretation circuit includes one or more active devices, one or more passive devices each electrically connected to a respective one of the active devices, and one or more comparators each electrically connected to a respective one of the active devices. Each of the active devices and the passive device electrically connected thereto are configured to provide a voltage level to the respective comparator to which the active device is connected. The comparator(s) are configured to indicate the resistive state of the memory element based on the provided voltage level(s).

15 Claims, 18 Drawing Sheets

(52) U.S. Cl.
CPC ...... *G11C 13/0028* (2013.01); *G11C 13/0069* (2013.01); *G11C 2013/0054* (2013.01); *G11C 2013/0092* (2013.01); *G11C 2213/77* (2013.01)

(58) Field of Classification Search
CPC .... G11C 2013/0054; G11C 2013/0092; G11C 2213/77
See application file for complete search history.

(56) References Cited

U.S. PATENT DOCUMENTS

| | | | | |
|---|---|---|---|---|
| 7,869,260 | B2 * | 1/2011 | Ueda | G11C 11/56 365/148 |
| 8,269,207 | B2 * | 9/2012 | Toda | G11C 11/56 257/2 |
| 2015/0332763 | A1 | 11/2015 | Yilmaz et al. | |
| 2015/0357034 | A1 | 12/2015 | Robinett | |
| 2016/0247565 | A1 | 8/2016 | Perner et al. | |

* cited by examiner

|      | CALCULATED (Ω) | SIMULATED (Ω) | % ERROR |
|------|----------------|---------------|---------|
| '01' | 10064          | 10166         | 1.003   |
| '10' | 20227          | 20590         | 1.763   |
| '11' | 25653          | 26067         | 1.588   |

*FIG. 5*

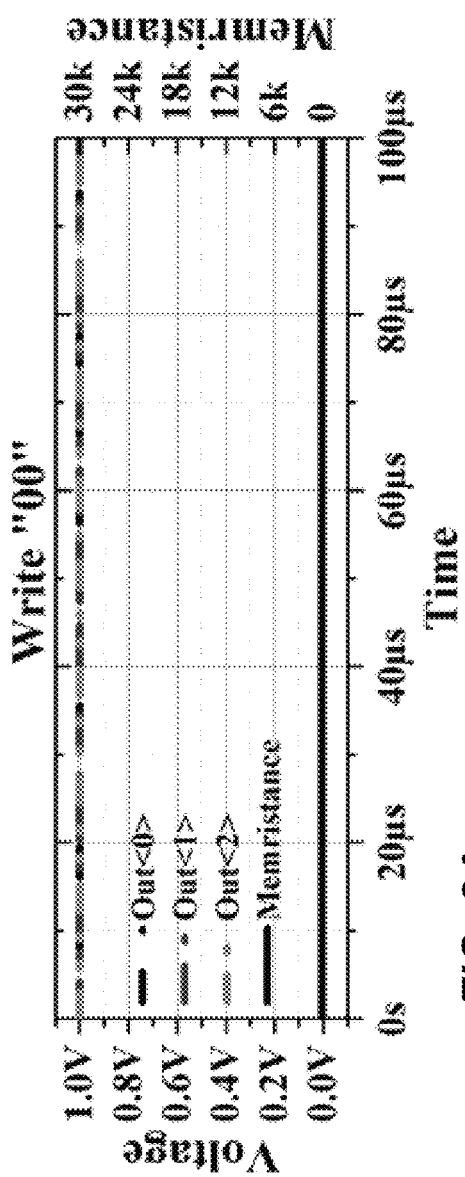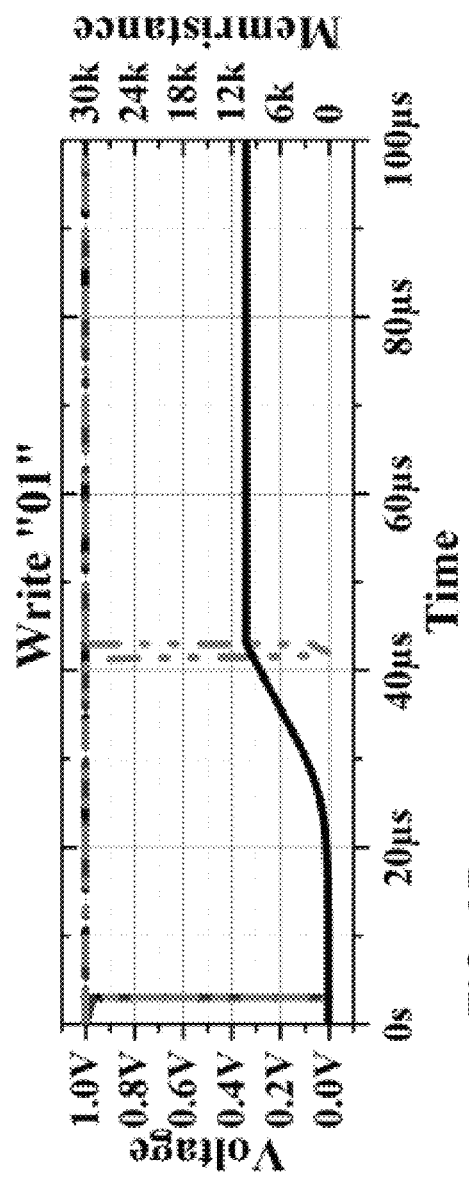
FIG. 8A
FIG. 8B

|      | 1.6V     | 1.55V    | MARGIN$_H$ | MARGIN$_L$ |
|------|----------|----------|------------|------------|
| '00' | 100 Ω    | 100 Ω    | 8801 Ω     | -          |
| '01' | 10166 Ω  | 8901 Ω   | 8099 Ω     | 1265 Ω     |
| '10' | 20590 Ω  | 18265 Ω  | 3125 Ω     | 2325 Ω     |
| '11' | 26067 Ω  | 23715 Ω  | 76285 Ω    | 2352 Ω     |

MULTI-LEVEL RESISTIVE MEMORY STRUCTURE

TECHNICAL FIELD

The present disclosure relates generally to electronic memory structures, and more particularly, to resistive memory structures, such as, for example and without limitation, resistive crossbar memory structures.

BACKGROUND

Nonvolatile memory technologies such as NAND flash memory devices have been generating increased market revenue due to the increased usage of these devices, especially in portable consumer electronics and solid state drives (SSDs). The trend toward cloud storage and computing is continuously demanding that enterprises invest especially in SSD-based storage architectures, as these provide higher performance compared to hard disk drives (HDDs).

Flash memories have been providing solutions to the ever-increasing high-performance storage demands with continued feature scaling. However, flash scaling is reaching its limits due to the increased reliability problems, such as, for example, the aging of the oxide used in such devices, charge leakage, retention problems, and the increased capacitive coupling between floating gates of neighboring cells. The approaching end of flash scaling has resulted in research into alternative nonvolatile memory technologies that can sustain the scaling trend. Many promising emerging technologies have been proposed, each with its own advantages and challenges. These include, for example, the following architecture: magnetoresistive random access memory (MRAM); spin-transfer torque random access memory (STT-RAM); and phase change random access memory (PCRAM) devices.

Of particular interest, however, is the resistive random access memory (RRAM) architecture which may be embodied in a resistive crossbar memory structure. Crossbar memory structures provide increased resistive memory cell density as compared to other architectures, as well as both single and multi-bit per cell storage capabilities. Crossbar memory architectures/structures are not without their drawbacks, however.

For example, various write schemes have been proposed for writing to the resistive memory elements or cells of a crossbar memory structure. One such scheme is a pulse-based scheme in which a pulse having predetermined amplitude is applied to the memory cell of interest for a predetermined duration. Another scheme is a feedback-based scheme in which a pulse having a predetermined amplitude is applied to the cell of interest for a duration that is dependent upon the output of a feedback circuit indicating that the cell has reached a desired resistive state (e.g., "01," "10," or "11"). While conventional feedback-based schemes have been shown to have advantages over conventional pulsed-based schemes, use of DAC, ADC, and/or multi-stage comparisons in the feedback circuitry can introduce significant peripheral circuitry overhead and can introduce latency in response time that can be significant when the memory structure is highly non-linear. Additionally, as will be appreciated by those having ordinary skill in the art, memory cells of the crossbar memory may experience a phenomenon known in the art as "resistance drift" caused, for example, by read/write disturbances in the array and sneak paths between cells in the array. Due to resistance drift, the programmed resistance value of a cell for a given state may change over time, and thus, different resistance values may be stored in different cells for the same state.

Accordingly, there is a need for crossbar memory structures and/or components thereof that minimize and/or eliminate one or more of the above-identified deficiencies or drawbacks, and/or decreases the complexity and latency in the circuitry of the structure and/or the read/write methodology while operating at CMOS compatible voltages.

SUMMARY

According to one embodiment, there is provided a resistive memory structure. The resistive memory structure comprises a resistive memory element, a resistance block configured to be electrically connected in series with the resistive memory element through an electrical node therebetween, and an interpretation circuit configured to be electrically connected to the electrical node and configured to interpret a voltage at the electrical node, and to indicate a resistive state of the resistive memory element based on the voltage at the node. The interpretation circuit comprises one or more active devices each having an input and an output, one or more passive devices each electrically connected to the output of a respective one of the one or more active devices, and one or more comparators each electrically connected to the output of a respective one of the one or more active devices. Each of the one or more active devices and the passive device electrically connected thereto are configured to provide a voltage level to the respective one of the one or more comparators to which the active device is electrically connected, the voltage level(s) provided to the comparator(s) being derived from the voltage at the electrical node. The one or more comparators are configured to indicate the resistive state of the memory element based on the provided voltage level(s).

According to another embodiment, there is provided a circuit for use in performing a read or a write operation on a resistive memory element. The circuit comprises an electrical node configured for electrical connection to the resistive memory element, a resistance block electrically connected to the electrical node, and an interpretation circuit electrically connected to the electrical node and configured to interpret a voltage at the electrical node and to indicate a resistive state of the resistive memory element based on the voltage at the node. The interpretation circuit comprises one or more active devices each having an input and an output, one or more passive devices each electrically connected to the output of a respective one of the one or more active devices, and one or more comparators each electrically connected to the output of a respective one of the one or more active devices. Each of the one or more active devices and the passive device electrically connected thereto are configured to provide a voltage level to the respective one of the one or more comparators to which the active device is electrically connected, the voltage level(s) provided to the comparator(s) being derived from the voltage at the electrical node. The one or more comparators are configured to indicate the resistive state of the memory element based on the provided voltage level(s).

According to yet another embodiment, a method of performing a read or write operation on a resistive memory element of interest of a crossbar memory structure having an array of resistive memory elements, wherein the memory element of interest is serially connected to a resistance block of a read circuit through an electrical node thereby forming a voltage divider between the memory element of interest and the resistance block, is provided. The method comprises applying a first voltage to the memory elements contained in a row of the array in which the memory element of interest is contained, applying a second voltage different than the first voltage to the memory elements contained in a column of the array in which the memory element of interest is contained, applying a third voltage different than both the first and second voltages to the memory elements contained in the row(s) of the array not containing the memory element of interest, and applying a fourth voltage different than each of the first, second, third voltages to the memory elements contained in the column(s) of the array not containing the memory element of interest. The method further comprises interpreting, by an interpretation circuit, a voltage at the electrical node, and determining a resistive state of the memory element of interest based on the voltage at the electrical node.

According to yet another embodiment, a method of performing a read operation on a resistive memory element of interest serially connected through an electrical node to read circuitry having an adjustable resistance, wherein the connection between the memory element of interest and read circuitry forms a voltage divider between the memory element of interest and the resistance of the read circuitry, is provided. The method comprises applying a selection voltage to the memory element, increasing the resistance of the read circuitry to a value that is greater than that used during the performance of a write operation, interpreting, by an interpretation circuit, a voltage at the electrical node, and determining a resistive state of the memory element of interest based on the voltage at the electrical node.

BRIEF DESCRIPTION OF THE DRAWINGS

Preferred exemplary embodiments will hereinafter be described in conjunction with the appended drawings, wherein like designations denote like elements, and wherein:

FIG. 5 depicts a table showing examples of both calculated resistance values and resistance values obtained during empirical testing/simulations for different resistive states of a resistive memory cell of a particular array of resistive memory cells;

FIGS. 8A-8D are graphical representations illustrating simulated write operations performed on a memory cell of a resistive memory structure, wherein FIG. 8A illustrates the writing of state "00," FIG. 8B illustrates the writing of state "01," FIG. 8C illustrates the writing of state "10," and FIG. 8D illustrates the writing of state "11;"

FIG. 11 depicts, in part, a table comparing illustrative programmed resistance values of a memory cell for different voltage levels determined during simulated testing;

DETAILED DESCRIPTION OF THE ILLUSTRATED EMBODIMENTS

In an embodiment, a resistive memory structure comprises a plurality of resistive memory cells or elements. Each resistive memory cell is configured to store one or multiple bits of data. For purposes of illustration, the description below will be primarily with respect to a resistive memory structure in the form of a crossbar memory structure having an array of resistive memory cells. It will be appreciated by those having ordinary skill in the art, however, that the present disclosure is not meant to be limited to crossbar memory structures, but rather the resistive memory structure of the present disclosure may find application in any number of other types of resistive memory structures, each of which remains within the spirit and scope of the present disclosure. It will be further appreciated that the present disclosure is also not intended to be limited to any particular type of resistive memory cell or element, but rather may find application in any suitable resistive memory cell/element.

In an embodiment, the cell structure of the array of the crossbar memory structure comprises a one (1) diode, one (1) resistor (1D1R) structure in which a series diode is integrated with each memory cell or the memory cell itself shows diode-like behavior. It will be appreciated by those having ordinary skill in the art, however, that the present disclosure is not meant to be limited to such a cell structure, but rather, other suitable cell structures (e.g., one transistor, one resistor (1T1R) or one resistor (1R)) may certainly be employed instead, each of which remains within the spirit and scope of the present disclosure.

Additionally, while the description below will be with respect to the memory cells of the memory structure being configured to store two (2) bits of data, it will be appreciated that in other embodiments the memory cells may be configured to store any number of bits of data, and thus, the present disclosure is not meant to be limited to any particular memory cell storage capacity or capability.

Figure 1:
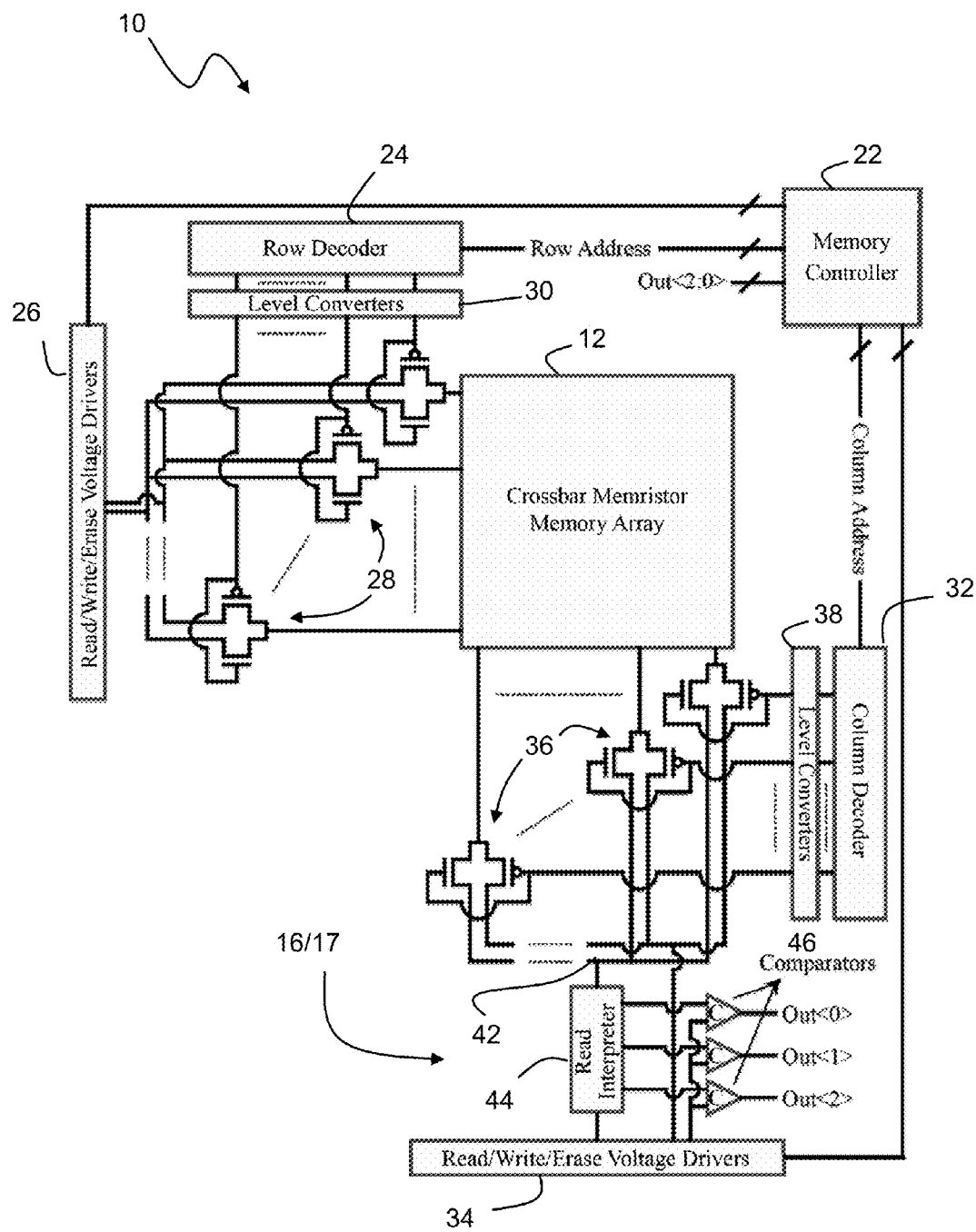
FIG. 1 is a diagrammatic and schematic illustration of one embodiment of a resistive memory structure.

FIG. 1 depicts an illustrative embodiment of a resistive memory structure 10 that includes, in part, a memory array 12 comprised of a plurality of memory cells 14 (best shown in FIG. 2), and read circuitry 16 comprised of one or more read circuits 17 that may be used, for example, in the performance of read, write, and/or erase operations performed on the memory cells 14 of the array 12.

Figure 2:
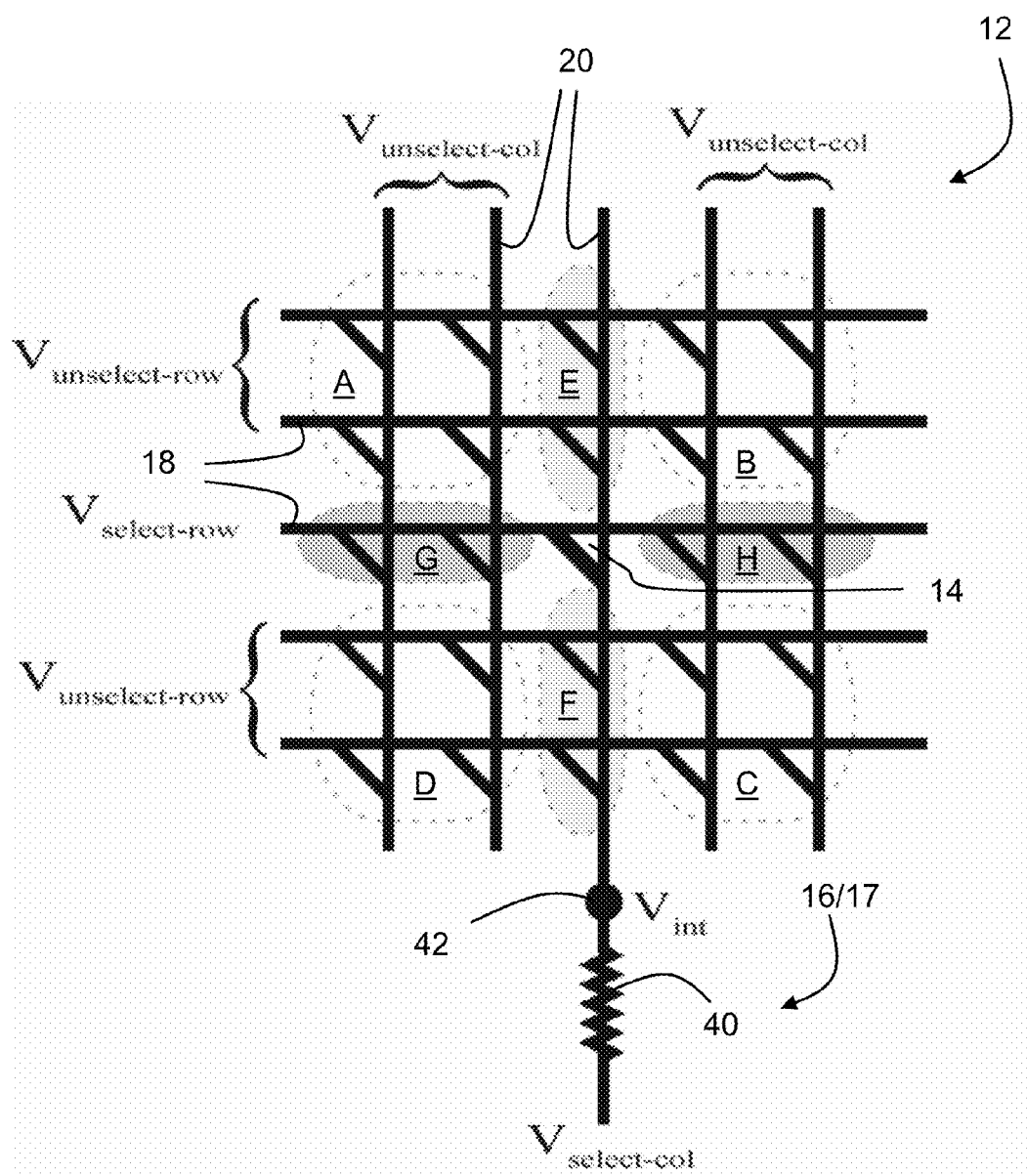
FIG. 2 is a diagrammatic and schematic illustration of a portion of the resistive memory structure shown in FIG. 1, wherein the resistive memory structure is a crossbar memory structure having an array of resistive memory elements.

In an embodiment, and as best shown in FIG. 2, the memory array 12 of the memory structure 10 comprises a first set of parallel conductors 18 (e.g., nanowires) (hereinafter referred to as "rows") and a second set of parallel conductors 20 (e.g., nanowires) (hereinafter referred to as "columns"), wherein the rows and columns are orientated at an angle with each other. As briefly described above, each of the memory cells 14 of the array 12 is configured to store one or multiple bits of data, and each memory cell 14 is respectively disposed between (i.e., at the intersection of) a single row and a single column of the array. In each instance, the combination of the memistor and the conductors or wires 18, 20 of the corresponding row and column serves to form a memory cell 14. As will be described more fully below, a single memory cell 14 may be selected for a read, write, or erase operation to be performed thereon when the row and column of the memory array 12 corresponding thereto is "selected." To select a row, a read, write, or erase voltage of a particular magnitude is applied to that particular row; and to select a column, a read, write, or erase voltage of a particular magnitude that is different than the magnitude of the voltage applied to the selected row is applied to that particular column. These voltages will hereinafter be referred to as "selection voltages" (i.e., "$V_{select-col}$" and "$V_{selec-row}$"). Rows and columns of the array 12 that are not selected (or "unselected") are respectively biased with voltages that are different from both each other and the selection voltages. These voltages will hereinafter be referred to as "unselect voltages" (i.e., "$V_{unselect-col}$" and "$V_{unselect-row}$"). In an embodiment, the relationship between the various selection and unselect voltages is as follows: $V_{select-row} > V_{unselect-col} > V_{unselect-row} > V_{select-col}$.

Turning back to FIG. 1, the memory structure 10 may further include a memory controller 22 that is configured to control which of the columns and rows of the memory array 12 are to be selected for a read, write, or erase operation to be performed on a particular cell 14. The controller 22 comprises a processing unit and one or more memory or other storage devices. The processing unit may include any type of suitable electronic processor (e.g., a programmable microprocessor or microcontroller, an application specific integrated circuit (ASIC), etc.) that is configured to execute appropriate programming instructions for software, firmware, programs, algorithms, scripts, etc., to perform various functions, such as, for example and without limitation, those described herein. The memory device may include any type of suitable electronic memory means and may store a variety of data and information. This includes, for example and without limitation, software, firmware, programs, algorithms, scripts, and other electronic instructions that, for example, are required to perform or cause to be performed one or more of the functions described elsewhere herein.

The memory structure 10 may further include a row decoder 24 electrically connected to the controller 22, one or more read/write/erase voltage drivers 26 for supplying voltages to the rows of the array 12, and a plurality of electrical switching devices 28 (e.g., one or more p- or n-type transistors or any other suitable type of switching device(s), each corresponding to a respective row of the array 12) electrically connected between the row decoder 24 (i.e., either directly or through one or more other components, e.g., one or more level converters 30), the row voltage drivers 26, and the rows of the array 12. The controller 22 is configured to provide a control signal to the row decoder 24 indicating the row in which a memory cell 14 of interest is located (i.e., the memory cell on which a read, write, or erase operation is to be performed). In response, the row decoder 24 is configured to activate the relevant switching device(s) 28 in a manner in which the appropriate bias voltages are applied by the row voltage drivers 26 to the appropriate rows (e.g., $V_{select-row}$ to the row containing the memory cell of interest, and $V_{unselect-row}$ to the other rows).

Similarly, in an embodiment, the memory structure 10 further includes a column decoder 32 electrically connected to the controller 22, one or more read/write/erase voltage drivers 34 for supplying voltages to the columns of the array 12, and a plurality of electrical switching devices 36 (e.g., one or more p- or n-type transistors or any other suitable type of switching device(s), each corresponding to a respective column of the array 12) electrically connected between the column decoder 32 (i.e., either directly or through one or more other components, e.g., one or more level converters 38), the column voltage drivers 34 (either directly or indirectly through the read circuitry 16), and the columns of the array 12. The controller 22 is configured to provide a control signal to the column decoder 32 indicating the column in which the memory cell 14 of interest is located. In response, the column decoder 32 is configured to activate the relevant switching device(s) 36 in a manner in which the appropriate bias voltages are applied by the column voltage drivers 34 to the appropriate columns (e.g., $V_{select-col}$ to the column containing the memory cell of interest, and $V_{unselect-col}$ to the other columns).

As briefly described above, the read circuitry 16 is configured to be used in the performance of read, write, and/or erase operations performed on the memory cells 14 of the array 12. The read circuitry 16 may comprise one or more individual read circuits 17 for performing these operations. In an embodiment such as that shown in FIG. 3, a read circuit 17 of the read circuitry 16 may comprise a resistance block 40 electrically connected in circuit (e.g., in series) to a selected memory cell 14 through an electrical node 42 (or "intermediate node 42") therebetween. In an embodiment, the resistance block 40 may comprise a single resistor or resistor element. In other embodiments, however and as will be described below, the resistance block 40 may comprises a plurality of resistors or resistor elements each of which may be selectively connected to the electrical node 42. In addition to the resistance block 40, the circuit 17 may further include an interpretation circuit 44 configured to be electrically connected to the intermediate node 42.

In an embodiment, each memory cell 14 of the resistive memory structure 10 has a dedicated read circuit 17 corresponding thereto; while in other embodiments, some or all of the memory cells 14 may be configured to share a read circuit 17. For example, and as shown in FIG. 2, in one implementation wherein the resistive memory structure 10 comprises a crossbar memory structure, the memory cells 14 in each column (or row, depending on the implementation) share a read circuit 17 (i.e., resistance block 40, node 42, and interpretation circuit 44). In another implementation, for example the implementation illustrated in FIG. 1, a single read circuit 17 may be used in conjunction with an array of electrical switching devices (e.g., switching devices 36) to allow every memory cell 14 of the resistive memory structure 10 to share a single read circuit 17. Thus, the present disclosure is not meant to be limited to the read circuitry 16 and the read circuit(s) 17 thereof having any particular structure or implementation.

In an embodiment, the resistance block 40 of the read circuit 17 is configured to be electrically connected in series to the selected memory cell 14, thereby forming a voltage divider between the selected memory cell 14 and the resistance block 40 when the resistance block 40 is connected to the memory cell 14. The resistance value of the resistance block 40 may be fixed or, in at least some embodiments, may be adjustable or variable such that the resistance block 40 may assume different resistance values for different operations performed on a memory cell 14 (e.g., a higher value for a read operation and a lower value for a write operation, as will be described more fully below). In any event, the electrical connection between the series resistance 40 and the memory cell 14 may be a direct connection meaning that the series resistance 40 may be directly connected to the memory cell 14. Alternatively, the connection may be an indirect connection meaning that the series resistance 40 may be connected to the memory cell 14 via or through one or more additional components or circuit elements. For example, in the embodiment illustrated in FIG. 1, the series resistance 40 may be connected to the memory cell 14 via one or more of the switching devices 36.

By virtue of the aforementioned voltage divider configuration, the intermediate node 42 will have a unique voltage value (referred to below as "intermediate node voltage" or $V_{int}$) that is dependent upon the resistive state of the selected memory cell 14 and the resistance of the resistance block 40 of the read circuit 17 when the row and column selection voltages (i.e., $V_{select-col}$ and $V_{select-row}$) are applied to the memory cell 14. The number of resistive states that a particular memory cell 14 may have is dependent upon the number of bits it is configured to store. For example, in an embodiment wherein a memory cell 14 is configured to store a single bit, the memory cell 14 may have two (2) different resistive states—one (e.g., low resistive state) for a logic "0," and one (e.g., high resistive state) for a logic "1." Similarly, if the memory cell 14 is configured to store two (2) bits of data, the memory cell 14 may have four (4) different resistive states, one for each of the logic states "00," "01," "10," and "11."

The uniqueness of the voltage at the electrical node or intermediate node 42 allows for the use of the interpretation circuit 44 of the read circuit 17 to determine the exact resistive state of the selected memory cell 14, and therefore, to read the data stored in the memory cell 14 and represented by the resistive state thereof, and/or to monitor the resistive state of the selected cell in real time during a write operation.

The interpretation circuit 44 can include complex circuitry to implement various node voltage interpretation techniques, or may, as will be described below, include a relatively simple and efficient technique and circuit.

Figure 3:
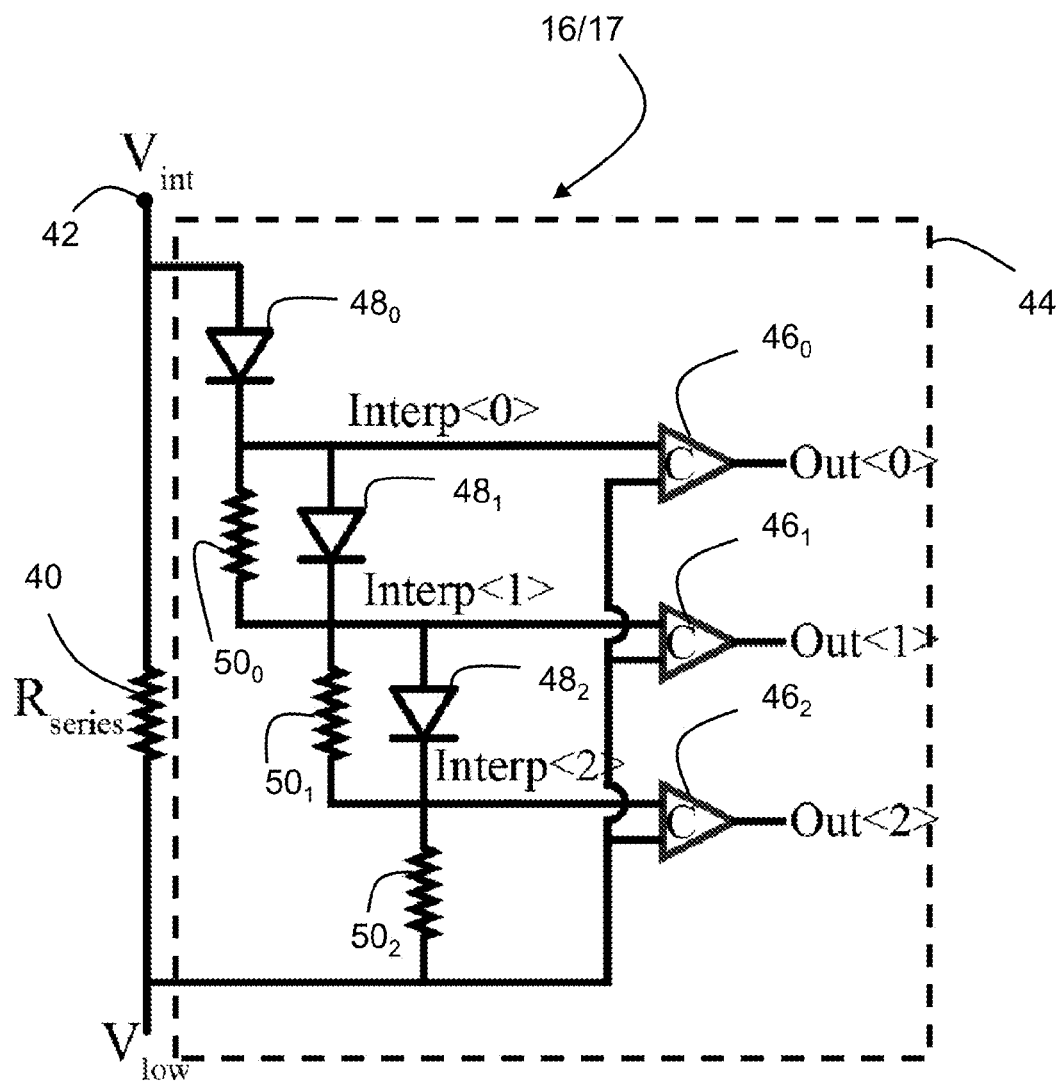
FIG. 3 is a diagrammatic and schematic illustration of an embodiment of read circuitry of a resistive memory structure such as that shown in FIG. 1.

For example, in an embodiment such as that illustrated in FIG. 3, the interpretation circuit 44 may include one or more comparators 46 (e.g., comparators $46_0$-$46_2$). The comparators 46 may be used to compare voltage levels derived from the intermediate node voltage $V_{int}$, which, in an embodiment, may be lower than $V_{int}$, against one or more reference voltages from one or more voltage sources (e.g., the column selection voltage $V_{select-col}$) to determine or indicate the resistive state of the selected memory cell 14. In an illustrative embodiment, each comparator 46 may compare a respective voltage level derived from the intermediate node voltage $V_{int}$ against the same reference voltage represented in FIG. 3 as $V_{low}$ and which, in at least some embodiments, is the column selection voltage $V_{select-col}$. The interpretation circuit 44 may further include one or more active devices and/or one or more passive devices that may be utilized to generate or provide the voltage levels derived from the intermediate node voltage, which, in turn and as briefly described above, can be used by the comparators 46 to interpret the intermediate node voltage, and therefore, determine or indicate the resistive state of the selected memory cell 14. The active device(s) may comprise, for example, one or more diodes 48 (e.g., diodes $48_0$-$48_2$ in FIG. 3), diode-connected transistors (e.g., NMOS or PMOS), and/or other suitable devices. The passive device(s) may comprise, for example, one or more resistors 50 (e.g., resistors $50_0$-$50_2$ in FIG. 3).

In an embodiment such as that illustrated in FIG. 3 wherein the circuit 44 includes both active and passive devices, the output of each active device (e.g., diode 48) may be electrically connected to a respective passive device (e.g., resistor 50). The resistance(s) of the resistor(s) 50 may be relatively high (e.g., on the order of 1MΩ) in order to minimize the affect the interpretation circuit 44 has on the intermediate node voltage $V_{int}$. As shown in FIG. 3, each of the resistors 50 may be electrically connected between the output of a corresponding diode 48 and the input of a respective comparator 46. More particularly, in the embodiment illustrated in FIG. 3, the input of diode $48_0$ is electrically connected to the intermediate node 42 and the output of the diode $48_0$ is electrically connected to both the comparator $46_0$ and the resistor $50_0$, which is electrically connected between the diode $48_0$ and the comparator $46_k$. The input of the diode $48_1$ is also electrically connected to the output of the diode $48_0$, and the output of the diode $48_1$ is electrically connected to resistor $50_0$, the comparator $46_1$, and the resistor $50_1$, which is electrically connected between the diode $48_1$ and the comparator $46_2$. Finally, the input of the diode $48_2$ is electrically connected to the output of the diode $48_k$, and the output of the diode $48_2$ is electrically connected to resistor $50_1$, the comparator $46_2$, and resistor $50_2$, which is electrically connected between the diode $48_2$ and the comparator $46_2$ and each of comparators $46_0$-$46_2$.

In any event, in an embodiment wherein interpretation circuit 44 includes one or more diodes 48, and depending on the implementation, the diode(s) 48 can be electrically connected serially, in parallel, or a combination of both, to generate or provide different diode voltage levels that are input or provided to respective comparators 46.

As was described elsewhere above, in an instance where the memory cell 14 of the array 12 is configured to store two (2) bits of data, there are four (4) resistive states that encode the bits stored in the memory cell 14 (i.e., "00," "01," "10," and "11"). For these four (4) unique states, four (4) different voltage levels are generated at the intermediate node 42. In an embodiment such as that illustrated in FIG. 3 wherein the interpretation circuit 44 includes and utilizes serially connected diodes 48 (and, in an embodiment, resistors 50), three (3) such diodes 48 (i.e., diodes $48_0$-$48_2$) are needed to distinguish between these four different voltage levels. More particularly, in an embodiment, the outputs of the three diodes $48_0$-$48_2$ are electrically connected to respective comparators 46 (i.e., comparators $46_0$-$46_2$) to determine if the voltage level at the intermediate node 42 has reached a certain voltage. Incidentally, the series diode $48_0$ provides a close-to-constant voltage reduction in the intermediate node voltage $V_{int}$ thereby providing compaction of the resistive states. Also, the outputs of the diodes 48 are analog outputs, the values of which decrease as the resistance of the cell 14 being read or monitored increases.

The resistance value of the resistance block 40 and the selection voltages used to select the memory cell 14 (i.e., the row and column voltages $V_{select_r}$ and $V_{select-col}$) are picked such that if the resistive state of the memory cell 14 is "00," the memory cell 14 is at the lowest resistance, and if the resistive state is "11," the memory cell 14 is at the highest resistance. It follows, then, that if the resistive state is "01," the memory cell 14 is at a resistance greater than that corresponding to state "00," but less than that corresponding to state "11;" and if the resistive state is "10," the memory cell 14 is at resistance greater than that corresponding to states "00" and "01," but less than that corresponding to state "11." This leads, in an embodiment, to the outputs of the comparators 46 (Out<0>-Out<2> in FIGS. 1 and 3), being logic high (i.e., "1") when the resistive state of the memory cell 14 is "00," and being logic low (i.e., "0") when the resistive state of the memory cell 14 is "11." Accordingly, in such an embodiment, the output signal of a comparator 46 is "high" when the input signal from the diode 48 electrically connected thereto (i.e., diode voltage levels) does not match the reference voltage to which the voltage level represented by the input signal is compared, and "low" (i.e., "0") when the input voltage level and reference voltage do match. It follows, then, that when the state of the memory cell 14 is "01," the comparator output signals Out<0> and Out<1> will be "high," and output signal Out<2> will be "low." And when the state of the memory cell 14 is "10," the comparator output signal Out<0> will be "high" and the rest will be "low."

It will be appreciated that while in the embodiment described above, the comparator output signals are "high" when the voltages represented by the input signals from the diodes do not match the reference voltage to which the diode output voltages are compared, and "low" when they do, the opposite may be true in alternate implementations. Accordingly, in another embodiment, the comparator output signals are "low" when the diode output voltages do not match the reference voltage and "high" when they do.

Additionally, it will also be appreciated that while in the embodiment described above state "00" reflects the memory cell 14 being at the lowest resistance, and state "11" reflects the memory cell 14 being at the highest resistance, in other embodiments, the opposite convention may be used. That is, in some embodiments, state "11" reflects the memory cell 14 being at the lowest resistance and state "00" reflects the memory cell being at the highest resistance. In such an embodiment it follows, then, that if the resistive state is "10," the memory cell 14 is at a resistance greater than that corresponding to state "11," but less than that corresponding to state "00;" and if the resistive state is "01," the memory cell 14 is at resistance greater than that corresponding to states "11" and "10," but less than that corresponding to state "00." Accordingly, the present disclosure is not meant to be limited to any one particular logic scheme.

In an embodiment, the output signals of the diodes 48 (Interp<0>-Interp<2>) in FIG. 3 are unique analog outputs, and their values decrease as the resistance of the selected memory cell 14 being read or monitored increases. The interpretation circuit 44 is configured such that the output signal Interp<2> falls below the corresponding comparator switching threshold before Interp<1> does, and the output signal Interp<1> falls below the comparator switching threshold before the Interp<0> signal. Each output signal Interp falling below the corresponding comparator switching threshold indicates that a particular resistive state is reached. It will be appreciated, however, that operation in the opposite fashion is all possible.

In any event, the "encoded" comparator output signals Out<0>-Out<2> may be used as control signals during, for example, write and/or erase operations performed on the memory cells 14 of the array 12 of the memory structure 10. Further, the structure and methodology described above may enable the simultaneous observation of the change of resistance in the selected memory cell 14 while selection voltages are applied so as to allow accurate programming of a given memory cell 14.

It will be appreciated by those having ordinary skill in the art that the built-in or turn-on thresholds of the active device(s), e.g., the diodes 48, determine the density of the resistive states of a given memory cell 14. For instance, if the built-in thresholds are lower, the density increases meaning the resistance values for different states get closer. Additionally, in an embodiment wherein the interpretation circuit 44 comprises a plurality of diodes 48 connected in parallel, as opposed to a plurality of serially-connected diodes 48 as is illustrated in FIG. 3, a plurality of different built-in or turn-on thresholds (each diode having a different built-in or turn-on threshold) would be needed for a memory cell configured to store two bits of data.

Additionally, the particular number of built-in thresholds, and thus, diodes (or active device) 48, and comparators 46 that are needed for the interpretation circuit 44 is dependent upon the number of bits stored in the corresponding memory cell 14 (or the number of bits the memory cell 14 is configured to store). More particularly, for multi-bit memory cell 14 storing, or being configured to store, "n" bits of data, $2^n-1$ active devices, and unique built-in thresholds corresponding thereto, and comparators 46 are needed. If the voltage level generating devices (i.e., active devices) are diodes, then $2^n-1$ diodes are also needed. For example, in an embodiment such as that described above and illustrated in FIG. 3 wherein the memory cell 14 is configured to store two (2) bits of data, the interpretation circuit 44 needs three (3) diodes 48 (and, in an embodiment, resistors 50) and three (3) comparators 46 (i.e., $2^2-1=3$). Certain conventional structures/methods require the use of $2^{(n+1)}-2$ comparators and reference resistors. Accordingly, for a memory cell storing two (2) bits of data, six (6) comparators and reference resistors are required. As such, the structure and method described herein reduces the number of comparators needed by half (3 vs. 6).

While the description above has been primarily with respect to the read circuitry 16 of the memory structure 10 having a single read circuit 17 that is configured to perform a read function during both read and write operations, in another embodiment (not shown) memory structure 10 may include a pair of read circuits—one for performing a read function during a write operation, and one for performing a read function during a read operation. In such an embodiment, the two read circuits 17 may have substantially the same structure as that described above with respect to circuit 17 with one exception being that the value of the resistance block 40 of one of the circuits 17 would be different than the value of the resistance block 40 of the other circuit 17. As will be described below, this arrangement or configuration allows for an increased series resistance value of the read circuitry 16 to be used for a read function performed during a read operation as compared to the resistance value used during a write function. Each of the two read circuits 17 may be selectively coupled to the intermediate node 42 through one or more switching devices (e.g., transistors) that may be electrically connected to and configured to be controlled by the memory controller 22 to allow for the different circuits to be used for different operations. Accordingly, it will be appreciated that the present disclosure is not intended to be limited to the use of any particular number of read circuits in the performance of the read and write operations performed on the cells 14 of the of the structure 10.

As briefly described above, in an embodiment, a unique voltage biasing scheme is used to carry out certain operations performed on the memory cells of the memory structure 10. For example, during a write operation on a selected memory cell 14, the voltage bias across the selected memory cell should exceed the memory cell threshold, $V_{mth}$, to achieve a fast write operation, whereas in order to minimize the resistance change of the unselected or so-called "half-selected" memory cells (i.e., memory cells located in the same column or row as the selected memory cell), the voltage bias across these memory cells should be kept lower than the threshold of the memory cells. To achieve this, and as briefly described above, a biasing scheme is employed in which: a first voltage, $V_{select\text{-}col}$, is applied to the column containing the memory cell of interest (i.e., the selected cell); a second voltage, $V_{unselect\text{-}col}$, is applied to the columns of the array 12 not containing the selected memory cell; a third voltage, $V_{select\text{-}row}$, is applied to the row containing the selected memory cell; and a fourth voltage, $V_{select\text{-}row}$, is applied to the rows not containing the selected memory cell. As also described above, in an embodiment, these four (4) voltages are all different from each other, and their application results in an applied voltage value of $V_{int}$ on the intermediate node 42. The relationship between the biasing voltages, the intermediate node voltage $V_{int}$, and the memory cell threshold $V_{mth}$ for a particular embodiment can be summarized as follows:

$$|V_{select\text{-}row} - V_{int}| > V_{mth};$$

$$|V_{select\text{-}row} - V_{unselect\text{-}col}| < V_{mth};$$

$$|V_{unselect\text{-}row} - V_{int}| < V_{mth}; \text{ and}$$

$$|V_{unselect\text{-}row} - V_{unselect\text{-}col}| < V_{mth}.$$

The relationship summarized above can be satisfied by choosing voltage values in accordance with the following inequality: $V_{select\text{-}row} > V_{unselect\text{-}col} > V_{unselect\text{-}row} > V_{int} > V_{select\text{-}col}$.

The aforedescribed biasing scheme yields four (4) groups of memory cells that observe different voltage levels at their terminals as shown in FIG. 2, wherein in this particular example, the memory cells in regions A, B, C, and D see a voltage of $V_{unselect\text{-}row} - V_{unselect\text{-}col}$, the memory cells in regions E and F see a voltage of $V_{unselect\text{-}row} - V_{int}$, the memory cells in regions G and H see a voltage of $V_{select\text{-}row} - V_{unselect\text{-}col}$, and the selected memory cell 14 sees a voltage of $V_{selec\text{-}\_row} - V_{int}$. Since the value of $V_{int}$ changes during the programming of the memory cells, the voltage difference at the terminals of the unselected memory cells connected to the same columns as the selected memory cell is not constant. Therefore, it may be desirable to select voltage levels of the applied voltages such that the worst case voltage difference across the unselected memory cells in the same column as the selected memory cell is below the memory cell voltage threshold $V_{mth}$.

Figures 4A, 4B:
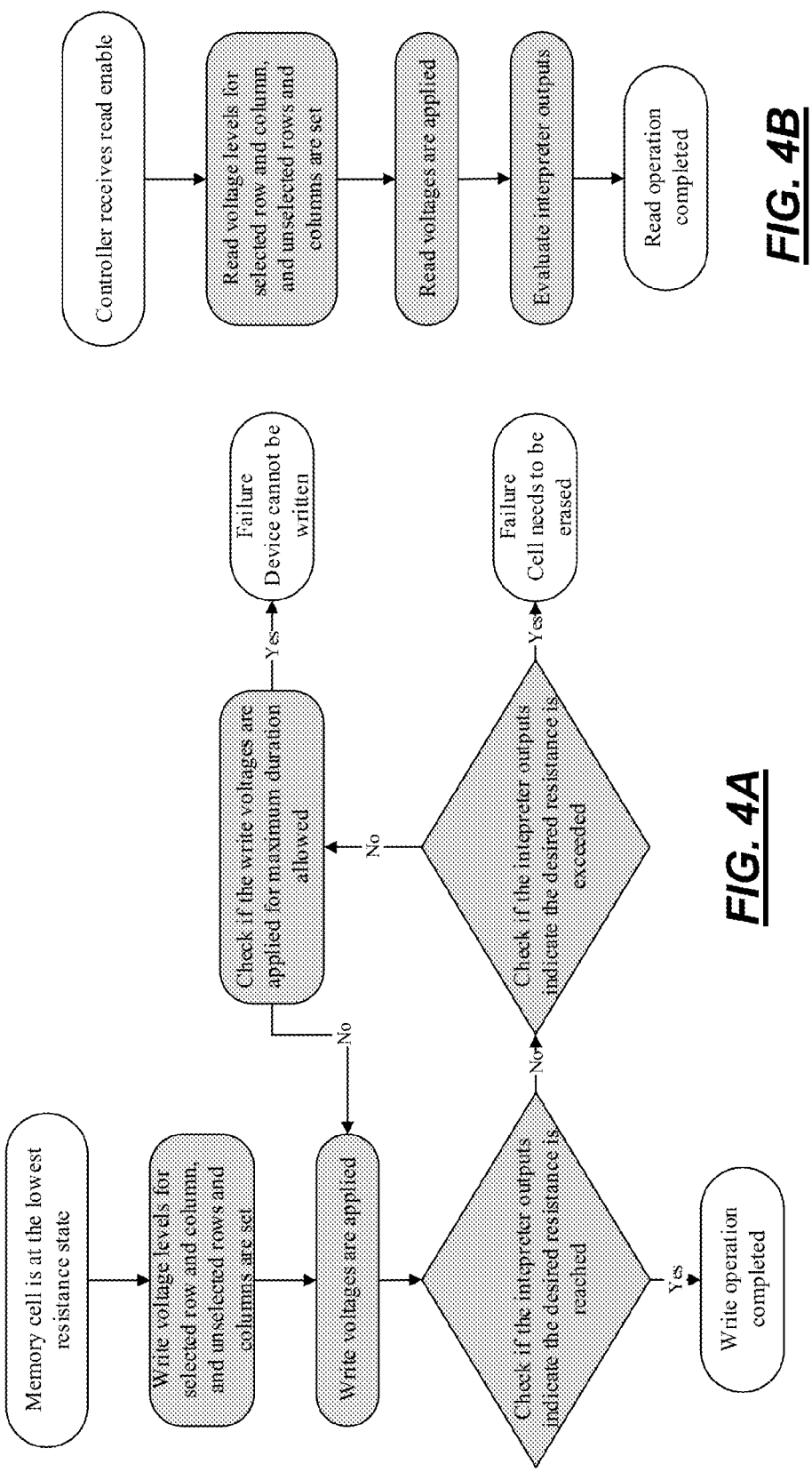
FIG. 4A is a flow chart illustrating various steps of an illustrative embodiment of a write operation to be performed on a resistive memory element of a resistive memory structure such as that shown in FIG. 1.
FIG. 4B is a flow chart illustrating various steps of an illustrative embodiment of a read operation to be performed on a resistive memory element of a resistive memory structure such as that shown in FIG. 1.

With reference to FIGS. 4A and 4B, a description will now be provided of the flow of illustrative read and write operations that may be performed on the memory cells 14 of the memory structure 10 using the various components of the memory structure 10 described above. FIG. 4A illustrates an example of the flow of a write operation performed on a selected memory cell 14. For purposes of this example, it is assumed that at the beginning of the write operation the selected memory cell 14 is at the erase state, which, in an embodiment, corresponds to the lowest resistive state, e.g., "00." (It will be appreciated, however that in other embodiments, the erase state may correspond to the highest resistive state, e.g., "11" as opposed to the lowest resistive state.) After the memory controller 22 is prompted to perform the write operation, it signals both the row and column voltage drivers 26, 34 to apply the appropriate biasing voltage levels to the rows and columns of the array 12, and enables the row decoder 24 and column decoder 32 to facilitate the application of the voltages on the selected and unselected rows and columns.

As the respective biasing voltages are applied, the read circuitry 16, and the interpretation circuit 44 of the read circuit 17 thereof connected to the intermediate node 42, in particular, generates distinct analog voltage levels Interp that directly depend on the intermediate node voltage $V_{int}$, which, in turn, is directly dependent upon, and translates into, the resistance value of the selected memory cell 14. As the resistance of the selected memory cell 14 increases, the Interp signal levels begin to decrease. As soon as one of these voltage levels Interp reaches a reference voltage to which it is compared by one of the comparators 46, the corresponding comparator output signal Out "flips" from high to low (or low to high, depending on the implementation). In response, the memory controller 22 checks to see if the comparator outputs indicate that the desired resistive state has been reached. If the controller 22 determines that the desired state has, in fact, been reached, the controller 22 causes the application of the biasing voltages to cease or terminate. The output signals Out of the comparators 46 then return to their initial state (e.g., high). If, on the other hand, the controller 22 determines that the desired state has not yet been reached, the application of the biasing voltages continues.

FIG. 4A also illustrates optional steps relating to write protection and failed memory cell detection mechanisms used in known flash memories that can be included and used during a write operation performed on a memory cell of the memory structure 10. In any event, the use of the outputs Interp of the interpretation circuit 44 as control signals for the write operation results in more precise resistances being programmed to the memory cell 14. This leads to the narrowing of resistance distributions for each possible state of the memory cell 14.

Whereas FIG. 4Aa illustrates a write operation that may be performed on a memory cell 14 of the memory structure 10, FIG. 4B illustrates a read operation. The read operation may be similar to the write operation except that in at least some embodiments, the biasing voltage levels and the read circuitry 16 may have different characteristics. When the memory controller 22 is prompted to perform a read operation on a particular memory cell 14, it signals the row and column voltage drivers 26, 34 to apply biasing voltages on the rows and columns of the array 12 that are appropriate for the read operation, and enables the row decoder 24 and column decoder 32 to facilitate the application of these voltages on the selected and unselected rows and columns.

In an embodiment, the biasing voltages (i.e., $V_{select\text{-}col}$, $V_{unselect\text{-}col}$, $V_{select\text{-}row}$, and $V_{unselect\text{-}row}$) applied during the read operation have the same value or magnitude as the voltages applied during the write operation, but are applied for a shorter duration to prevent or at least limit the alteration of the resistive state of the memory cells 14 in the array 12 of the memory structure 10. In other embodiments, however and as will be described below, one or more (e.g., all) of the biasing voltages applied during the read operation may have a different (e.g., lower) value or magnitude as compared to the voltage(s) applied during the write operation. Additionally, in an embodiment, the value of the series resistance 40 of the read circuitry 16 electrically connected to the intermediate node 42 may be the same during both read and write operations; while in other embodiments, the value of the series resistance may be different (i.e., increased) for a read operation. In the latter instance, the resistance value of the read circuitry may be adjusted in a number of ways.

For example, in an embodiment, the resistance block 40 of a read circuit 17 may be comprised of two resistors having different resistance values that may be selectively coupled to the intermediate node 42 through respective switching devices (e.g., transistors) that are electrically connected to and configured to be controlled by the memory controller 22. In such an embodiment, the switching devices may be controlled or switched by the controller 22 to allow the series resistance connected to the electrical note 42 to be increased or decreased, respectively, depending on whether a read or write operation is being performed.

Figure 16:
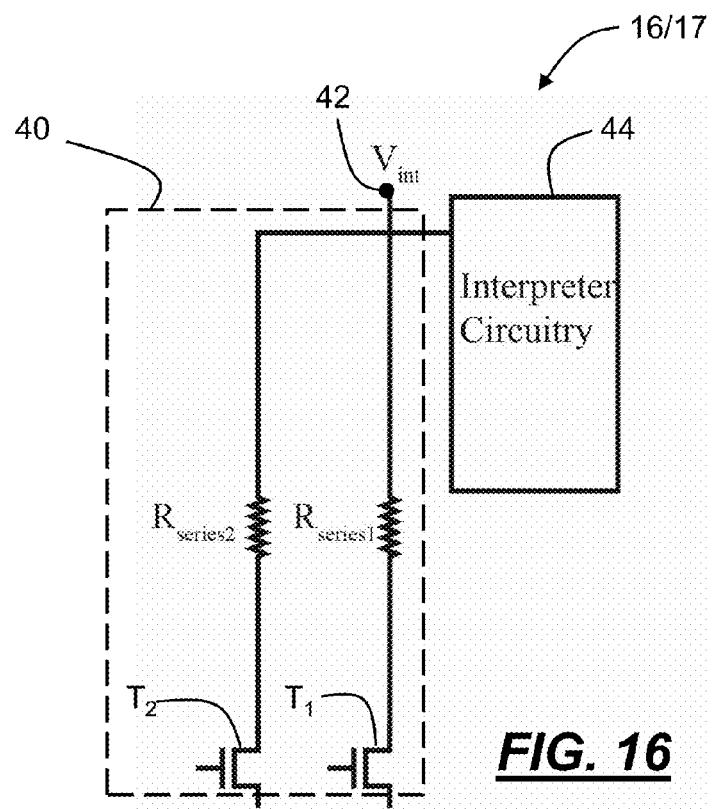
FIG. 16 is a diagrammatic and schematic illustration of another embodiment of read circuitry of a resistive memory structure such as that shown in FIG. 1.

In another similar embodiment such as that shown in FIG. 16, the resistance block 40 of a read circuit 17 may include two resistors $R_{series1}$ and $R_{series2}$ that are both configured to be electrically connected to the intermediate node 42, but that have different resistance values (i.e., resistor $R_{series2}$ having a larger resistance value than resistor $R_{series1}$). In this embodiment, the terminal of the first resistor $R_{series1}$ not connected to the node 42 is connected to a switching device, for example, a transistor $T_1$ that is controlled by the memory controller 22 to disconnect the resistor $R_{series1}$ from a voltage source and allow the terminal connected to the transistor to form an isolated floating node when use of the resistor $R_{series1}$ is not needed. Similarly, the terminal of the second resistor $R_{series2}$ not connected to the node 42 is connected to a switching device, for example, a transistor $T_2$ that is controlled by the memory controller 22 to disconnect the resistor $R_{series2}$ from a voltage source and allow that terminal to form an isolated floating node when use of the resistor $R_{series2}$ is not needed. Using this arrangement, the transistor $T_1$ is in the "closed" state and transistor $T_2$ is in the "open" state during a write operation to isolate the second resistor $R_{series2}$, and resistor $R_{series1}$, which has the lower resistance value, is used to perform the read function. When a read operation is to be performed, the transistor $T_2$ assumes the "closed" state and the transistor $T_1$ assumes the "open" state to allow the resistor $R_{series2}$, which has the higher resistance value, to be used to perform the read function, and resistor $R_{series1}$ is isolated.

In yet another embodiment such as that described above wherein the read circuitry 16 of the memory structure 10 includes one read circuit 17 for use in read operations and another, separate read circuit 17 for use in write operations, the series resistance of the read circuitry 16 may be adjusted by switching from one read circuit 17 having a lower series resistance value to another read circuit 17 having a higher series resistance value. Accordingly, any number of techniques may be used to increase the series resistance used during a read operation, and thus, the present disclosure is not intended to be limited to any particular technique(s).

In any event, one reason that it may be desirable to use different voltage magnitude(s) and/or a different series resistance value during a read operation that is different from that or those used during a write operation is that because the write operation programs memory cells to the point of detection, there is a significant read margin if and when the resistance of the memory cell being read drifts toward a higher resistance. However, there is no margin when the resistance drifts toward a lower resistance, and a lower resistance may lead to the wrong value being read. Reducing the applied biasing voltage(s) and/or increasing the series resistance of the read circuitry 16 serves to mitigate the potential problem of resistance drift toward a lower resistance value.

In an instance wherein the selected memory cell stores two (2) bits of data, as the biasing voltages are applied, the interpretation circuit 44 of the read circuit 17 electrically connected to the memory cell generates three (3) distinct Interp signals that, again, directly depend on the intermediate node voltage $V_{int}$, which, in turn, is directly dependent upon the resistance value of the selected memory cell 14. The Interp signals are fed into the comparators 46, and the output signals Out generated by the comparators 46 are indicative of the resistive state of the selected memory cell 14 and are used by the controller 22 to determine the resistive state. The read operation is then deemed complete. In an embodiment, and unlike the write operation, the read operation has a fixed duration which is kept as short as possible so as to reduce read disturbances which, as described below, can cause resistance drift in one or more memory cells 14 of the memory structure 10.

To understand how the component parameters of a read circuit 17 of the read circuitry 16 should be selected, a characterization of the behavior of the circuit 17 together with the memory cells 14 of the array 12 may be instructive. First, the dependence of the resistive state of a memory cell 14 on the intermediate node voltage $V_{int}$ may be characterized. Then, the dependence of the intermediate node voltage $V_{int}$ on the built-in or turn-on threshold of the series diode may be characterized based on the comparator resolution requirement of the comparison portion or stage of the circuit 17 and the current-voltage (IV) characteristics of the series diode in the interpretation circuit 44.

The analog voltage levels in or at the intermediate node 42 that correspond to the encoded resistive states can be characterized by expression (1):

$$V_{int} = V_{select\_col} + \frac{R_{series}(V_{select-row} - V_{select-col} - V_{mth})}{R_{parasitics} + R_{cells(s)} + R_{series}} \quad (1)$$

where $R_{cell(s)}$ is the resistance of the selected memory cell at a given state and $V_{mth}$ is the memory cell threshold. Parasitic sources represented by the lumped $R_{parasitics}$ term consist of the effective resistances of the switching devices 28, 36 and the crossbar resistance seen by the circuit 17. The voltage division "stage" of the circuit 17 outputs meet the equality of expression (2) when a particular state is being programmed:

$$V_{interp3-k} = V_{select-col} + \frac{(V_{int} - V_{diode1} - V_{select-col})}{3}k = V_{c-res} + V_{select-col} \quad (2)$$

where $V_{interp3-k}$ represents the voltage level at the corresponding voltage division stage output (Interp), k is the index of the corresponding voltage division stage output, $V_{diode1}$ is the threshold of the series diode 48₀ in the circuit 44, and $V_{c-res}$ is the comparator resolution. For analysis simplicity, the resistors 50 electrically connected to the outputs of the diodes 48 are assumed to have the same resistance value. However, in at least some implementations, it is possible to alter these resistances separately in order to tune the separation between resistive states of the selected memory cell. Where to set the resistive states is highly dependent on the non-linear behavior of the memory cell 14. Design decisions may also be made based on the trade-off between programming time and the resistive distribution or margins corresponding to the different resistive states.

Using expression (3) to solve for $V_{diode1}$ in expression (2) above yields:

$$V_{diode1} = V_{int} - V_{select-col} - \frac{3}{k}V_{c-res} \quad (3)$$

Expression (3) relates the intermediate node voltage with the series diode threshold. Another expression is required that relates the intermediate node voltage with the series diode threshold in order to be able to numerically obtain a value of the intermediate node voltage $V_{int}$, which can then be used with expression (1) to obtain a corresponding resistive state level. This additional expression can be obtained using the diode current equation and solving for the diode threshold.

The final expression is set forth in equation (4):

$$V_{diode1} = 3I_oR_h + V_{int} - V_{select-col} - \frac{kT}{nq}\text{Lambert-}W\left[\frac{3e^{\frac{3I_oR_h+V_{int}-V_{select-col}}{kT/nq}}I_oR_h}{kT/nq}\right]V_{c-res} \quad (4)$$

where Lambert-W is the lambert omega function, $R_h$ is the magnitude of the resistances connected to the diode outputs, $I_o$ is the reverse bias saturation current, n is the ideality factor, k is the Boltzmann constant, T is the absolute temperature, and q is the magnitude of the charge of an electron. Since $I_oR_h$ is so small, it can be omitted where it is an additive factor, resulting in a new simplified expression (5):

$$V_{diode1} = V_{int} - V_{select-col} - \frac{kT}{nq}\text{Lambert-}W\left[\frac{3e^{\frac{V_{int}-V_{select-col}}{kT/nq}}I_oR_h}{kT/nq}\right]V_{c-res} \quad (5)$$

Expressions (3) and (5) form a pair of expressions with two unknown parameters that can be evaluated together numerically to obtain a unique pair of $V_{int}$ and $V_{diode1}$ values which satisfy both expressions. A unique pair is obtained for each resistive state since expression (3) depends on the state to be encoded. After obtaining unique pairs, the next step is to evaluate expression (1) to obtain corresponding resistive states.

FIG. 5 depicts a table listing the resistances calculated using equations (1), (3), and (5) versus results obtained through empirical testing that comprised simulations using a 16×16 array model. The percent error in calculations are also listed. The disagreement between the simulated and the calculated results are less than 2% for each programmed state. The leakage through the half-selected memory cells also contributes to the intermediate node voltage $V_{int}$, however, the agreement between the simulated and calculated results indicates that this contribution to voltage mode reading is minimized especially owing the cell structure used (1D1R) and the array biasing scheme employed (i.e., four (4) different biasing voltages, as described above).

Simulations were conducted on a computer for the circuit structure and the read/write methodologies described herein utilizing a circuit model of memory structure 10 having a 16×16 array of memory cells 14 with the adoption of a distributed PI-model for the metal crossbars of the memory structure. It will be appreciated that while this testing was conducted with only the aforementioned model of the memory structure 10, the circuit structure and methodologies described herein are compatible with any resistive memory model wherein the resistance of a memory cell thereof can be altered when biased with a voltage and the model meets minimum and maximum resistances required for state encoding. Further, it will be appreciated that while the tested circuit structure included certain numbers and types of components (e.g., certain number of diodes, resistors, and/or comparators, a series resistor having a particular value, etc.), and certain testing/operational parameters were utilized (e.g., certain selection and unselect biasing voltage levels, pulse durations, etc.), the present disclosure is not meant to be limited to a particular composition of the tested circuit structure, nor the testing/operational parameters used during such testing.

Figure 6:
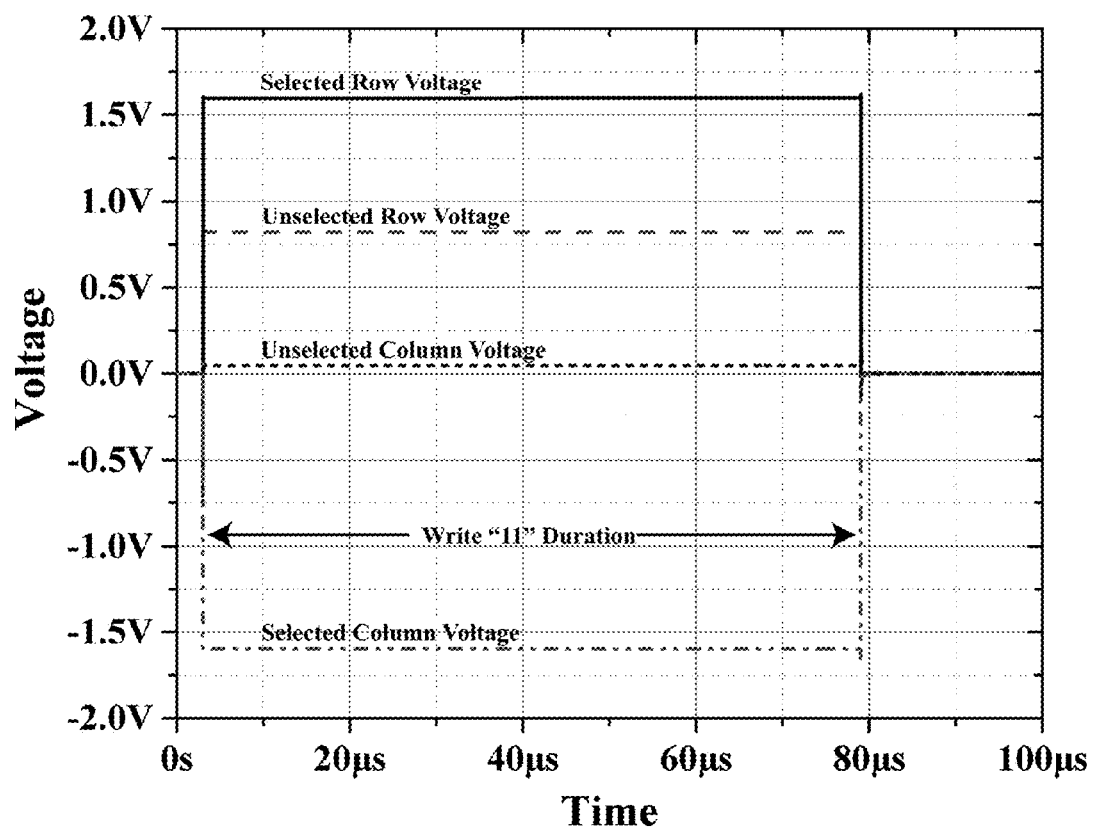
FIG. 6 is a graphical representation illustrating biasing voltages applied to an array of resistive memory cells during a simulated write operation performed on one of the memory cells in the array.

During testing it was determined that the interpretation circuit 44 was capable of performing a read operation during a write operation by actively monitoring the voltage change across the resistance block 40 serially connected to the selected column via selection circuitry (e.g., switching device(s) 36). The biasing voltages applied to the array 12 during a write operation are shown in FIG. 6. As explained above, such a biasing scheme ensures that the disturbances to the unselected memory cells are minimized while the selected memory cell is exposed to a relatively large voltage bias (i.e., $V_{select-col}$ and/or $V_{select-row}$) that is higher than the threshold of the memory cell $V_{mth}$. Example voltage levels shown in FIG. 6 are: $V_{select-row}=-V_{select-col}=1.6V$; $V_{unselect-row}=0.82V$; and $V_{unselect-col}=0.45V$.

Figure 7:
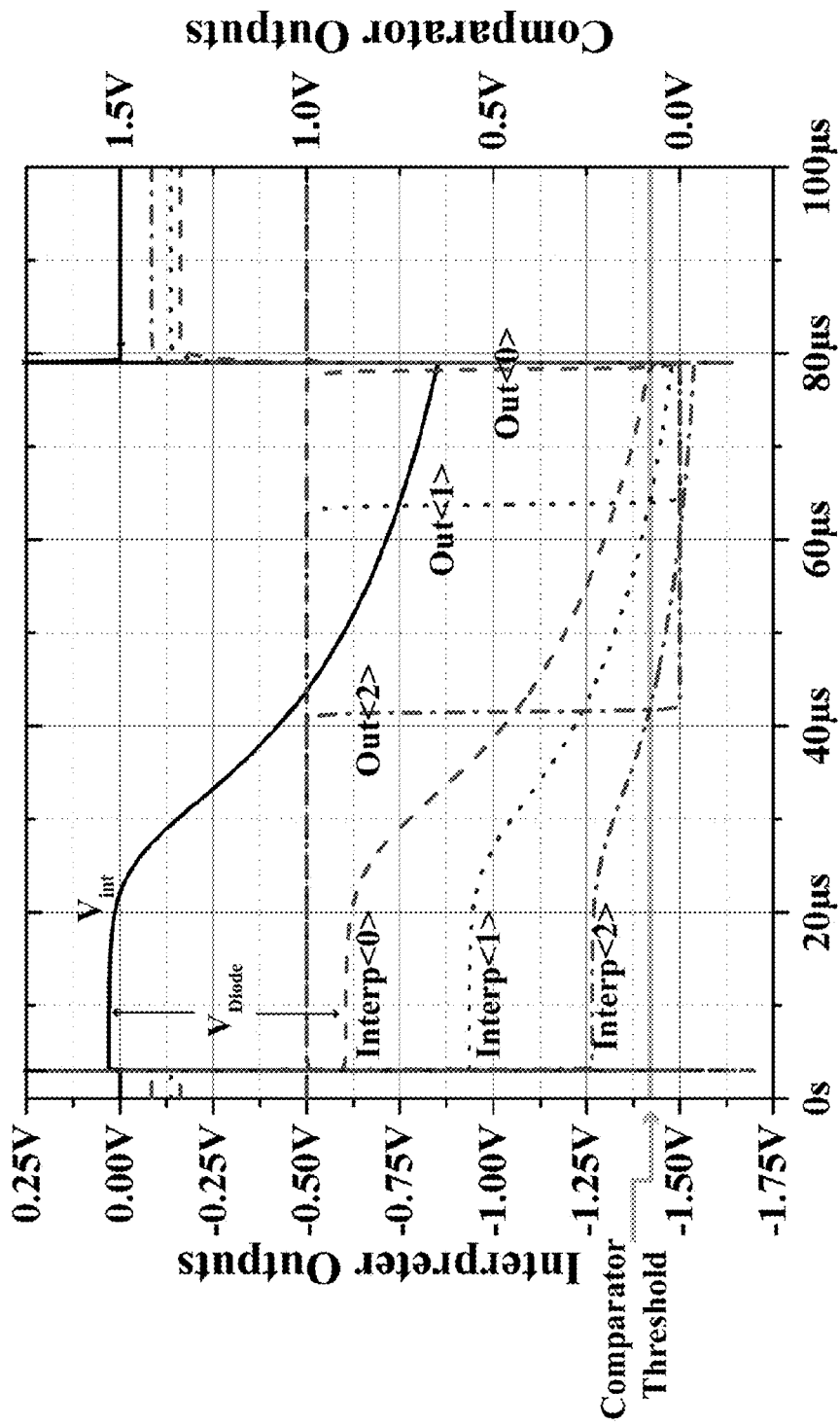
FIG. 7 is a graphical representation illustrating the operation of an interpretation circuit of a resistive memory structure during a simulated write operation performed on a memory cell of the resistive memory structure.
Figure 8C:
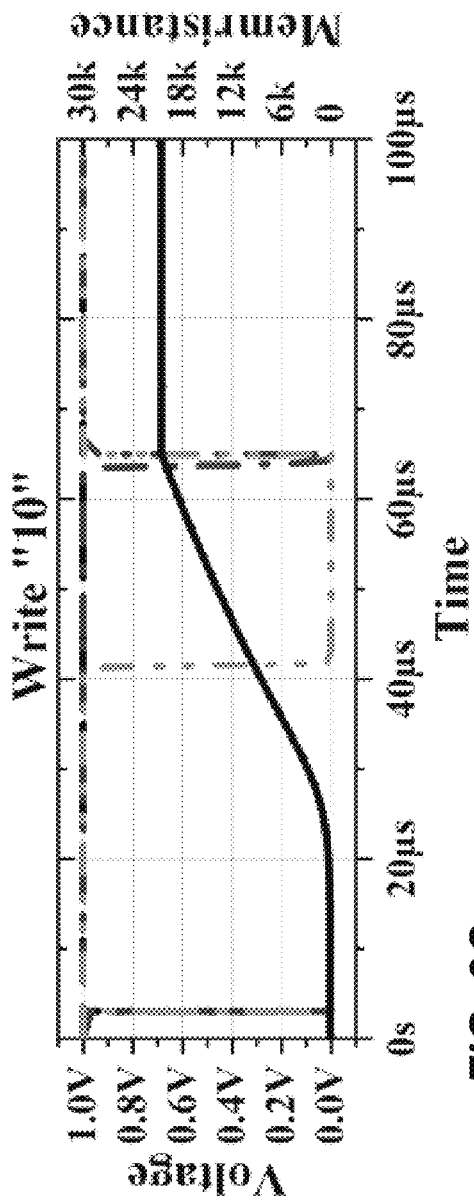
Figure 8D:
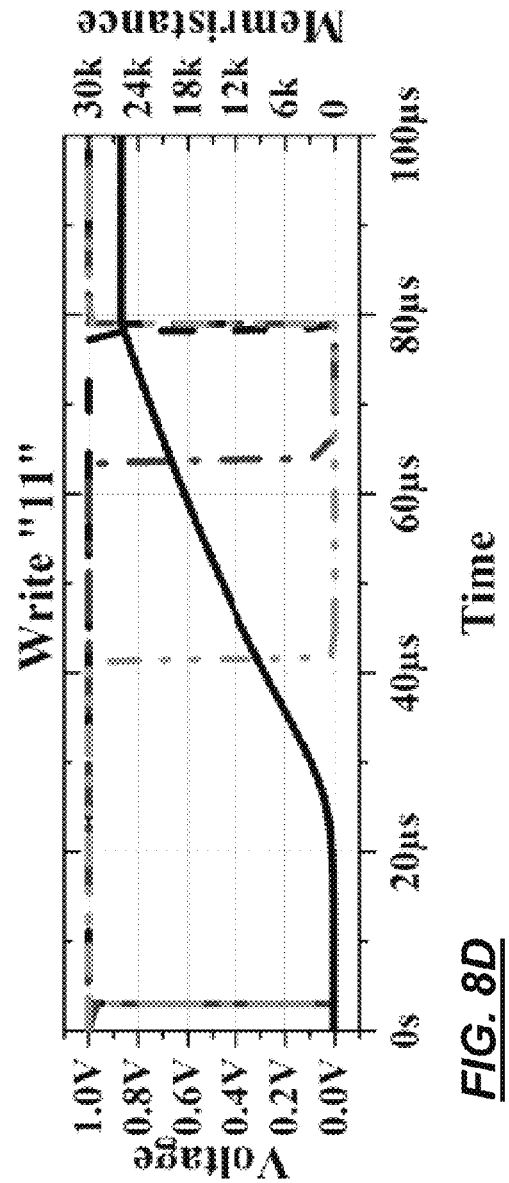

An example of the operation of the interpretation circuitry 44 during a write operation wherein the value being written is "11" is shown in FIG. 7. The voltage division portion of the read circuit 17 generates three (3) distinct Interp signal levels. These signals are fed to respective comparators 46 where the voltage level represented by the signal is compared to a reference voltage, which, in this example, is the selection voltage (i.e., $V_{select-col}$) that is also applied through the interpretation circuitry 44 (as shown in FIG. 3). Each of the comparators 46 generate a corresponding output signal Out that when taken together indicate if a certain state has been reached. The Interp signal levels decrease as the resistance of the memory cell being read increases. Once the signal level matches the selection voltage to which it is compared and reaches below the switching threshold of the comparator, the output signal Out of that comparator flips from high to low (or low to high, depending on the implementation), thereby providing a signal to the memory controller 22 which can then determine the current resistive state of the selected memory cell.

In simulations conducted, comparator outputs Out<2>, Out<1>, and Out<0> are respectively used to determine that states "01," "10," and "11" have been reached. As described above, the series diodes 48 provide a close-to-constant voltage reduction of the intermediate node voltage that is to be interpreted, allowing the Interp signals from the diodes 48 to reach the switching thresholds of the comparators more quickly; thus reducing the write or programming time, reducing disturbances to the resistance of the memory cells 14 in the array, and compacting the resistance levels.

FIGS. 8A-8D show the writing of states "00," "01," "10," and "11," respectively. Since "00" is the erase state of a memory cell, the memory controller 22 does not apply any voltage to the array 12 to change the state, and Out signals of all the comparators 46 remain high (or low, depending on the implementation). In the case of the "01," "10," and "11" states, as the resistance of the memory cell being written to or programmed increases, the Out signals of the comparators 46 start to become low one at a time. Once the desired resistance is reached, the memory controller 22 causes the application of the selection and unselect voltages to cease or terminate, and as a result, the Out signals of the comparators 46 become high again.

As described above, one drawback with crossbar memory structures is that the resistance values of the memory cells thereof may drift as a result of disturbances caused by the application of biasing voltages (i.e., selection or unselect voltages) during read and write operations. More particularly, even though each memory cell has a built-in threshold, a voltage bias applied to a memory cell that is below the threshold value may still induce a resistance change in the memory cell. This means that the resistance of the memory cell can drift over time due to, for example, the repeated reading of the memory cell or due to the read and write operations performed on other (e.g., neighboring or adjacent) memory cells in the array. To quantify the effects of read disturbances in the architecture of the memory structure 10 described above, simulations were performed to evaluate the resistance drift in memory cells neighboring a selected memory cell while the selected memory cell is repeatedly read. Since the amount of drift is state dependent, simulations were performed for different values stored in both the selected memory cell and the neighboring memory cells. For the purposes of the simulations, the same biasing voltage levels and series resistance of the read circuitry 16 (e.g., the resistance value of the resistance block 40 of a read circuit 17 connected to the selected memory cell) used during a write operation were also used to simulate the worst case drift, as any reduction in the biasing voltage(s) applied or increase in series resistance during a read operation would yield better drift characteristics.

Figure 9A:
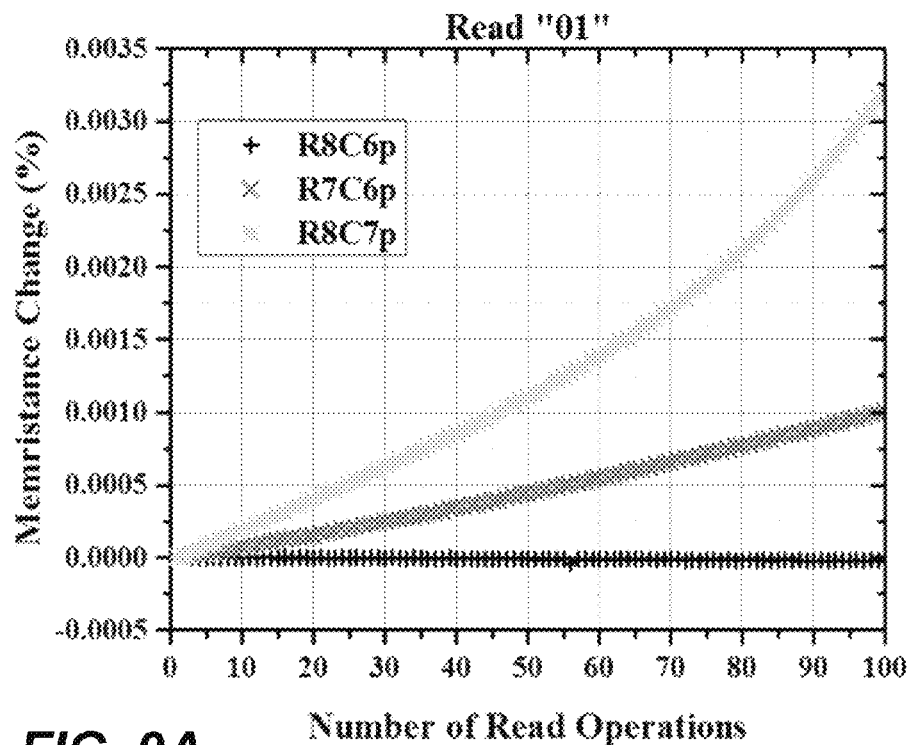
FIGS. 9A-9C are graphical representations showing the percent change of resistance in neighboring memory cells of an illustrative resistive memory structure versus the number of read operations performed on one of the memory cells of the resistive memory structure determined during simulated testing of the resistive memory structure.
Figure 9B:
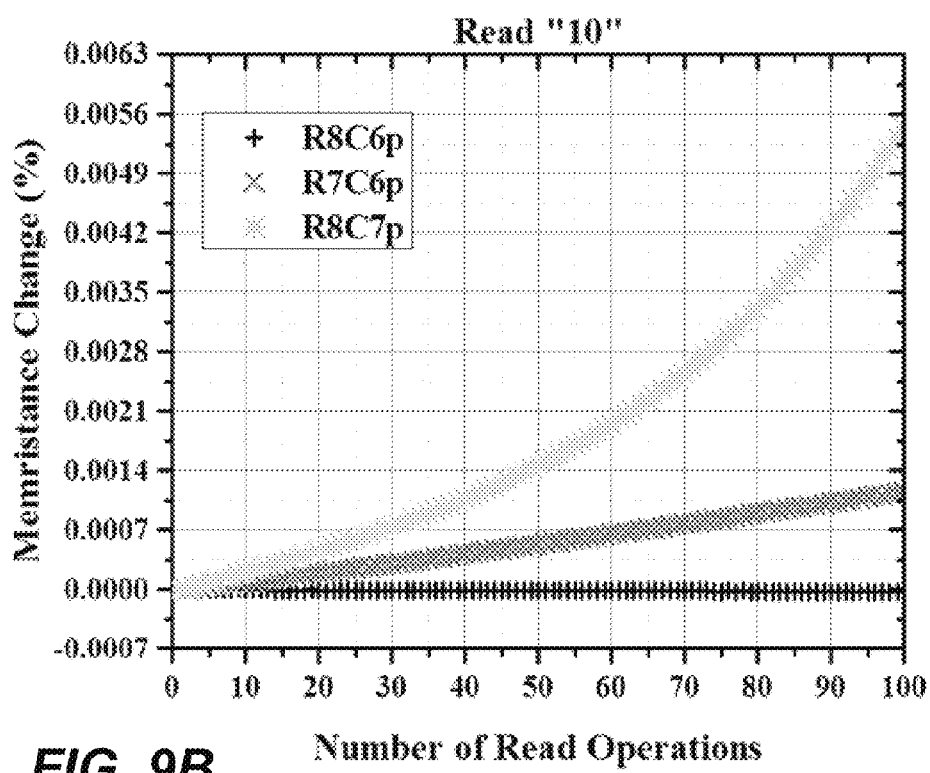
Figure 9C:
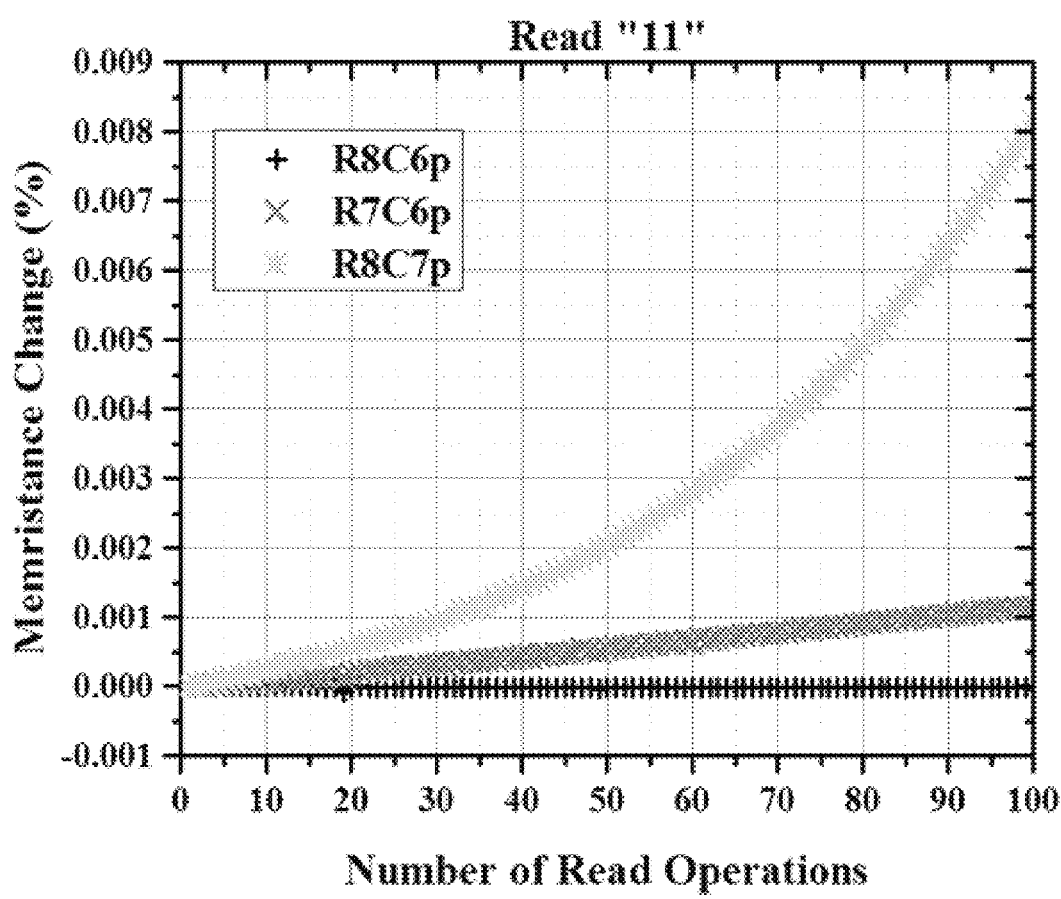

With reference to FIG. 9, which shows the percent change of resistance in neighboring cells versus the number of read operations performed, the simulations showed that for the states "01," "10," and "11" of a selected memory cell, which for the purposes of the simulations was the memory cell located at the intersection of row 7 and column 7 of the array 12 (R7C7), the greatest resistance drift was observed in the memory cells in the same column as the selected memory cell (i.e., column 7). For the memory cells in the same row as the selected memory cell (i.e., row 7), a lesser, yet still non-zero, resistance drift was observed. And for the remaining memory cells in the array, a close-to-zero drift was observed within the simulated 100 consecutive read operations. Among the three resistive states identified above, the greatest change was observed when the selected memory cell stored "11" due to the fact that the voltage bias across the unselected memory cells in the same column as the selected memory cell is the highest. In the case where the selected memory cell stored "00," no meaningful change in resistance was observed.

Figure 10:
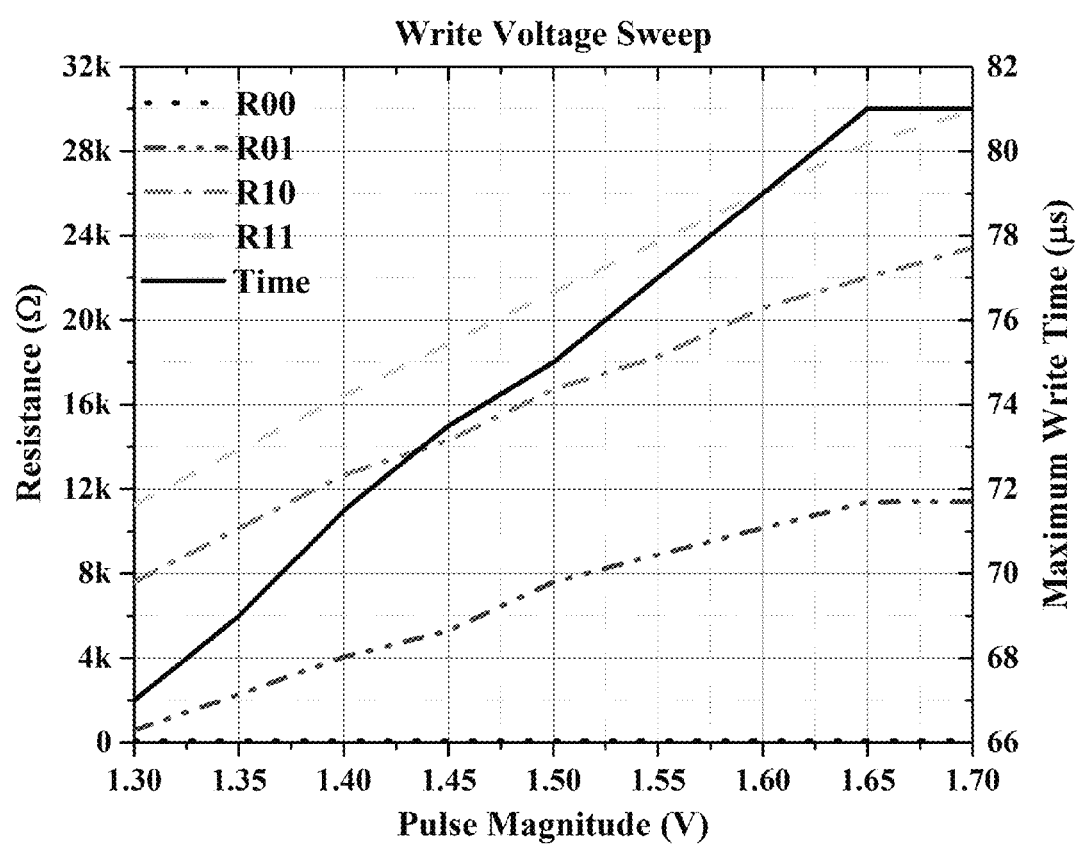
FIG. 10 is a graphical representation illustrating how resistive states of a resistive memory cell change with a write voltage sweep determined during simulated testing.

In addition to foregoing, simulations were performed to evaluate the effects of changes or variations in characteristics of certain circuit components of the memory structure 10, and read and write schemes used for programming and reading memory cells 14 of the structure 10. One such characteristic that was evaluated was the magnitude of the biasing voltage used during write operations performed on a memory cell (i.e., the magnitude of the "write voltage"). As indicated in expressions (1), (3), and (5) above, the programmed states of a selected memory cell are dependent on the level(s) of the voltage(s) used to bias the selected memory cell. If the biasing voltage levels are scaled, the programmed states change accordingly as shown in FIG. 10. The magnitudes of the column and row biasing voltages or selection voltages are listed along the x-axis, and while their magnitudes are equal, their signs are opposite. Although it is possible to scale the column and row unselect voltages separately, in the simulations performed the unselect voltages were reduced or increased by the same amount that the selection voltages were reduced or increased. It was observed that this scaling scheme provided more even scaling of the biasing voltages applied to the unselected and half-selected memory cells. The results of the simulations showed that as the voltage levels increased, both the programmed resistance levels and the programming time also increased. As the resistance increases, the separation between the different resistive states also increases, which can allow for better margins of detection. Because a read operation is effectively a write operation with a much shorter duration, the results shown in FIG. 10 have important consequences in terms of improving the tolerance for resistance drift in both increasing and decreasing directions. For example, if a memory cell is written or programmed at a biasing voltage of 1.6V, it can still be read at, for example, a biasing voltage of 1.55V while allowing drift in the resistance of the memory cell. This can be further clarified by comparing the programmed resistance values of a memory cell for both voltage levels as shown in the table provided in FIG. 11.

More particularly, FIG. 11 shows that in a simulation, 1.6V was used to program a selected memory cell to have the "11" state resulting in a resistance value of 26067Ω. However, reading this programmed resistance at 1.55V yields a value of "11" since 26067Ω is greater than 23715Ω, which, according to the table shown in FIG. 11, is the "11" value written at 1.55V. In fact, reading at 1.55V allows the programmed resistance of 26067Ω to drift up to the device maximum, which is assumed to be 100 kΩ, or down to the boundary of state "10," which for the simulations performed is 23715Ω. The table shown in FIG. 11 lists the high and low resistance margins that are the distances of the programmed resistances of the resistive states at a higher voltage level to the detection boundaries of the lower voltage reads. The margins may be optimized by scaling the circuit parameters that contribute to the resistive states as characterized elsewhere herein.

Figure 12:
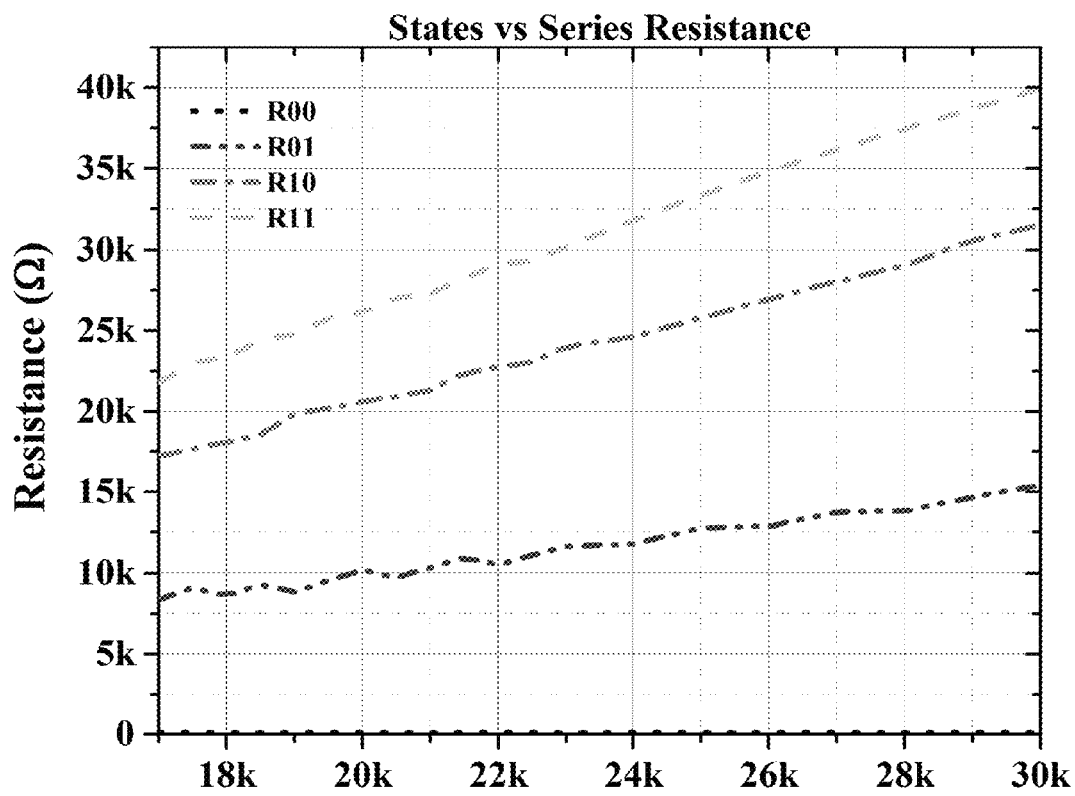
FIG. 12 is a graphical representation illustrating how a programmed state of a memory cell changes with different series resistance values determined during simulated testing.

Another characteristic that was evaluated was the series resistance value of the read circuitry 16 of the memory structure 10 (e.g., the resistance value of the resistance block 40 of the read circuit 17 connected to the selected memory cell). In addition to being dependent on the magnitude(s) of the biasing voltage(s) used to program a memory cell 14, the programmed states of a memory cell are also dependent on the value of the read circuitry series resistance connected to the electrical node 42, and therefore, the memory cell. FIG. 12 illustrates the change in programmed resistances versus the series resistance observed during the simulations performed. It was observed that for a selection voltage having a fixed magnitude of 1.6V, the increase in the series resistance results in an increase in the programmed resistances. As a result, the separation between resistive states increases with an increase in series resistance, which may provide a better margin of detection. Similar to the reduction in selection voltage, an increase in the series resistance when reading a memory cell allows for the generation of high and low margins, which, in turn, allows for resistance drift in both increasing and decreasing directions. One of ordinary skill in the art will appreciated that results similar to those shown in the table provided in FIG. 11 can be deduced from the values plotted in FIG. 12.

Yet another characteristic that was evaluated was the read scheme employed. Simulations showed that additional benefits can be obtained when both the read selection voltages and the series resistance of the read circuitry are both scaled as opposed to when just one of the voltages and series resistance are scaled. FIG. 10 indicates that it is not possible to scale the read selection voltages to 1.5V because the lower boundary for state "11" is 18891Ω, which is lower than the "10" boundary (i.e., 20590Ω) for 1.6V writes. This means that "10" written at 1.6V would be read as "11" if the memory cell was read at 1.5V. However, it was observed that the increase in series resistance has the opposite trend, and when the series resistance is increased, accurate or precise reads at less than 1.5V may be performed. The simulations showed that it is possible to write the resistance values at 1.6V with 20 kΩ series resistance, and then read at 1.5V with 25 kΩ series resistance, or read at 1.25V with 45 kΩ series resistance. A read scheme in which both the biasing voltage is reduced relative to the biasing voltage used in the write operation, and the series resistance is increased relative to the series resistance used in the write operation will be referred to below as a "reduced-impact read scheme," as disturbances to the resistance value of unread cells are reduced when such a scheme is utilized as compared to a scheme in which the selection voltage(s) and/or series is not adjusted, and thus, the scheme has a "reduced impact" as it relates to cell disturbances.

Figure 13A:
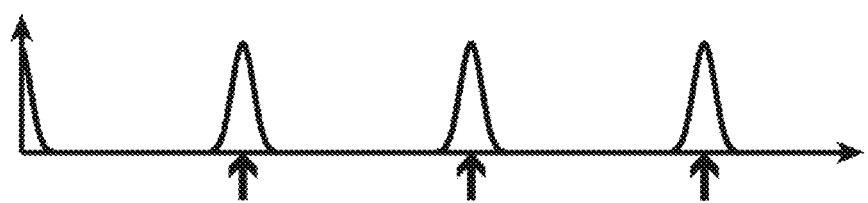
FIG. 13A is a graphical representation illustrating resistance distribution when a single resistive memory cell of an array of memory cells of an illustrative resistive memory structure is programmed determined during simulated testing.
Figure 13B:
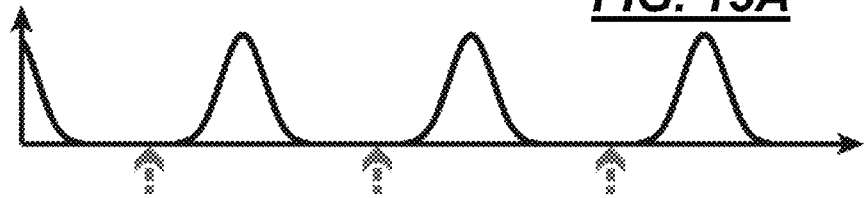
FIG. 13B is a graphical representation illustrating resistance distribution after all memory cells of an array of memory cells of an illustrative resistive memory structure are programmed determined during simulated testing.

FIGS. 13A and 13B aim to illustrate how the reduced-impact read scheme described above can work together with a write scheme such as that or those described elsewhere herein. When a single memory cell of an array is programmed, its resistance can land anywhere in the distributions shown in FIG. 13A, depending on its location within the array. In this case, the variation in resistance is due to the change in the lumped crossbar parasitic resistance seen by the read circuitry 16, which is dependent on the location of the memory cell 14 in the array 12. As more memory cells 14 of the array 12 are programmed, the resistances of the previously-programmed memory cells start to drift due to the write disturbances caused by the application of the biasing voltages (i.e., the selection voltages or the selection and unselect voltages), which causes the spreading of the resistance distributions as shown in FIG. 13B. The reduced-impact read scheme described above aims to reduce cell disturbances and shift the lower detection margins such that the new distributions fall completely within their intended resistive states. To that end, the solid arrows in FIG. 13A indicate sample cell resistances, and the dashed arrows in FIG. 13B indicate where the lower boundaries of the resistive states shift when the reduced-impact scheme is used.

Figure 14A:
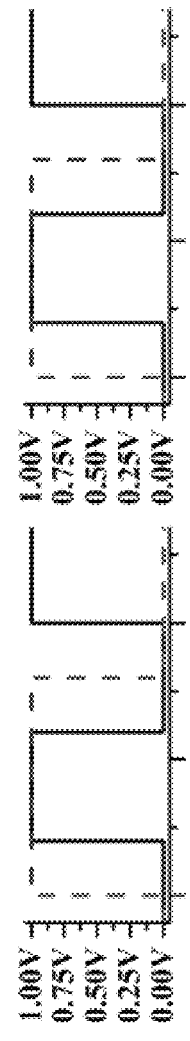
FIGS. 14A-14B depict simulation results of the performance of a reduced-impact read scheme on memory cells of a resistive memory structure storing four possible values "00," "01," "10," and "11" determined during simulated testing.
Figure 14A:
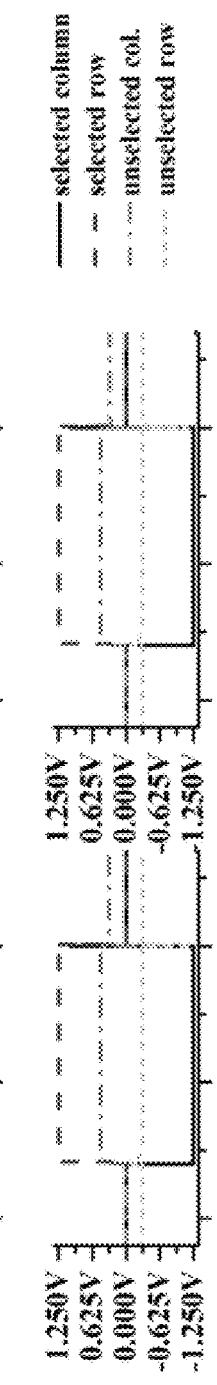
Figure 14A:
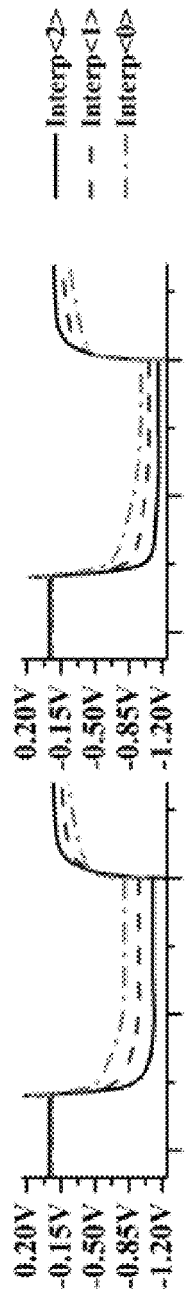
Figure 14A:
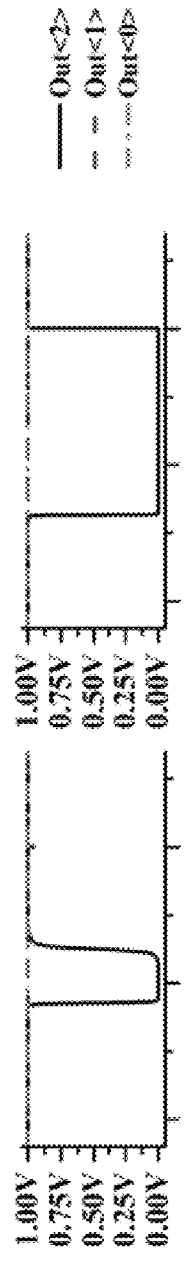
Figure 14A:
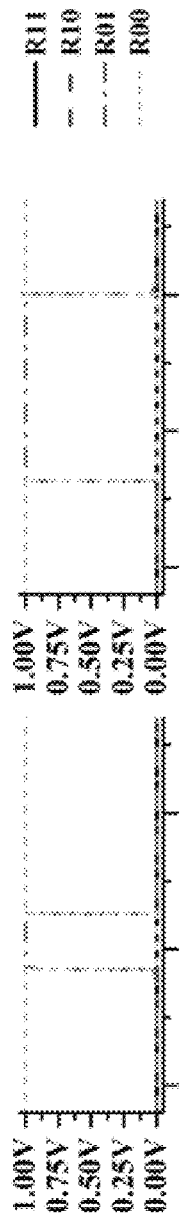
Figure 14B:
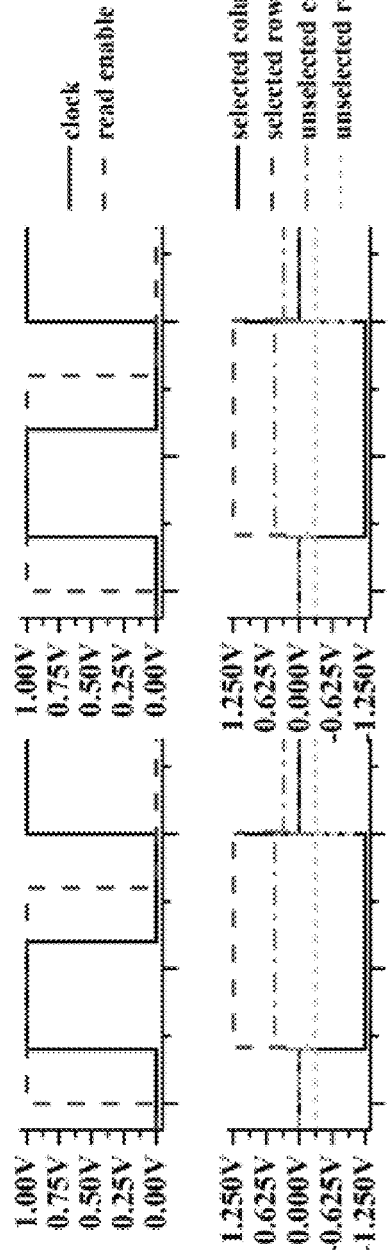

FIGS. 14A-14B show simulation results of the performance of the reduced-impact read scheme described above on memory cells storing the four possible values "00," "01," "10," and "11." In the simulations, a memory cell 14 located at the middle of array 12 of the circuit model of the memory structure 10 was selected. The read scheme used a 1.25V read biasing voltage with a series resistance of 45 kΩ. In each case, when the memory controller 22 of the memory structure model received the read enable signal, it facilitated the application of the biasing voltages (i.e., selection and unselect voltages) on the rows and columns of the array 12. These figures show how the Interp signals of the interpretation circuit 44 settle depending on the value that memory cell is storing. The Interp signals settle in decreasing order, hence the output signals Out of the comparators 46 flip in the decreasing order as well. Signals R11, R10, R01, and R00 are the memory controller signals indicating whether a particular state is detected. The sequential flipping of the Out signals of the comparators 46 also cause signals R11, R10, R01, and R00 to flip; however, the correct result is obtained at the end of the read operation.

Figure 15B:
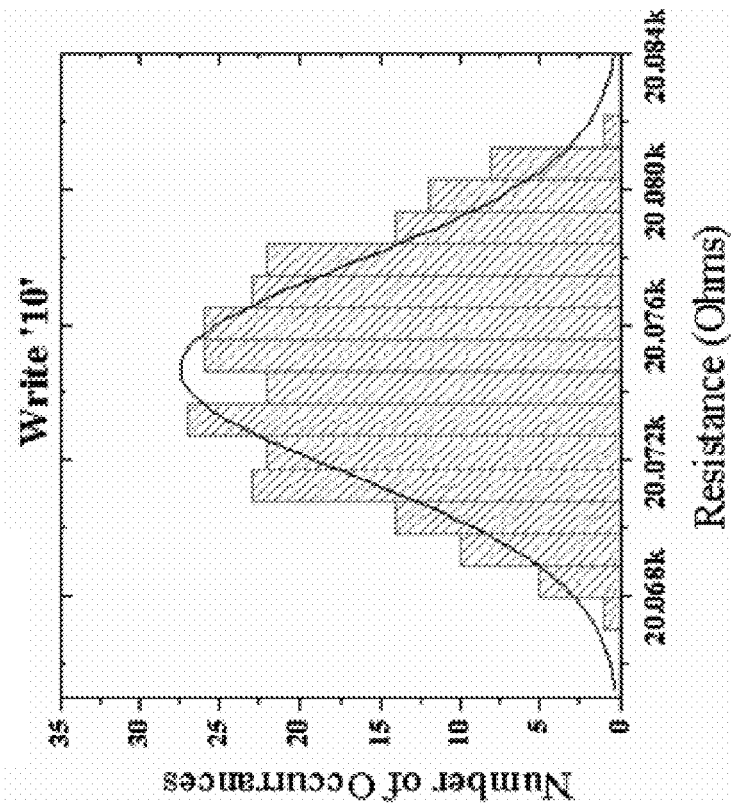
FIGS. 15A-15C are graphical representations illustrating resistance distributions after all memory cells of an array of memory cells of an illustrative resistive memory structure are programmed with the same value, wherein FIG. 15A corresponds to a resistive state of "01," FIG. 15B corresponds to a resistive state of "10," and FIG. 15C corresponds to a resistive state of "11," determined during simulated testing.
Figure 15A:
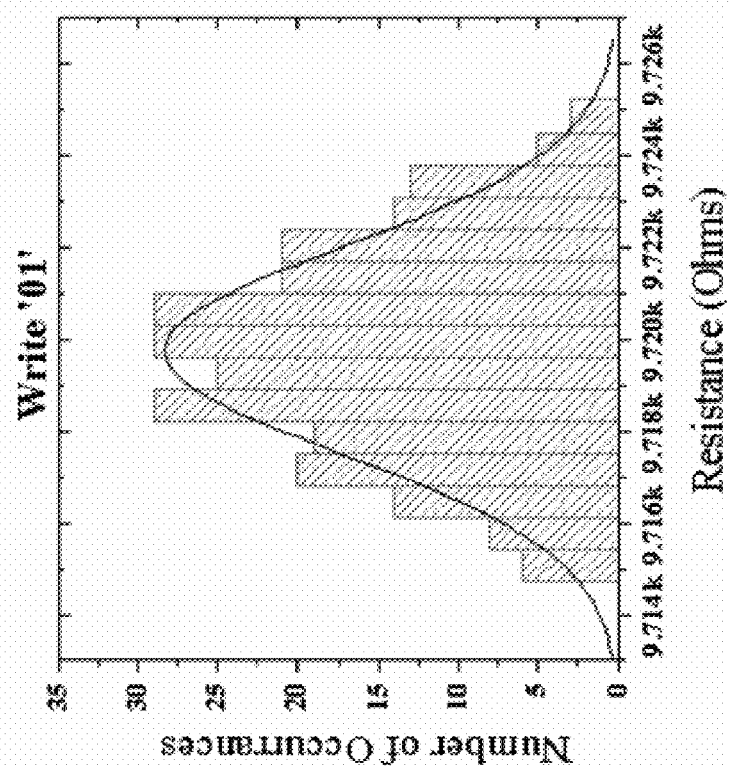
Figure 15C:
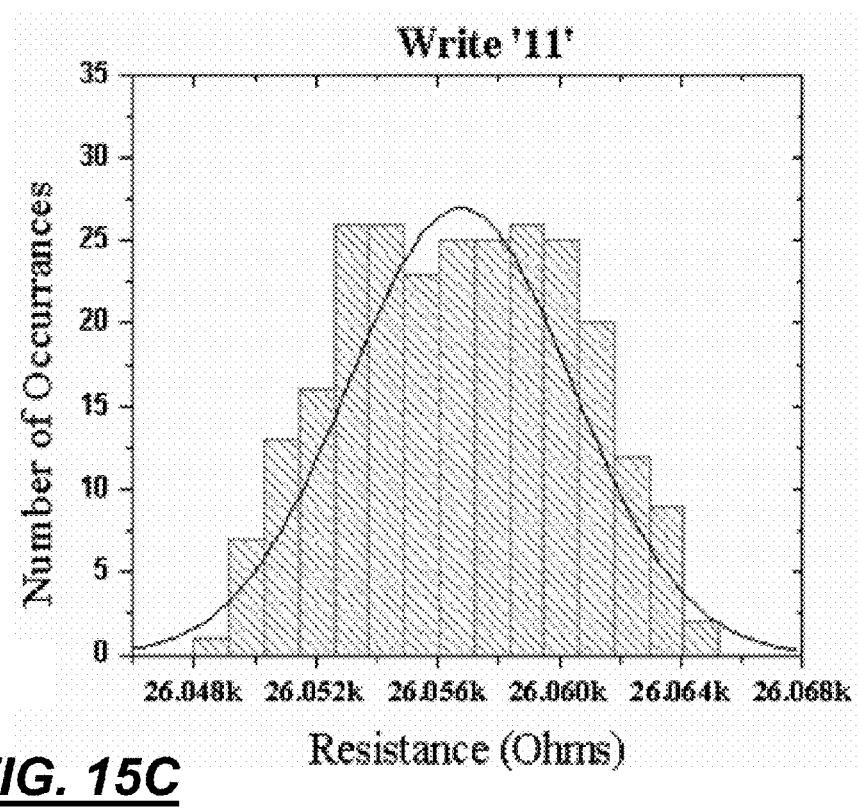

As with consecutive read operations, consecutive write operations on memory cells that neighbor an unselected or half-selected memory cell may cause the resistance of that unselected or half-selected memory cell to drift over time. Even though unselected and half-selected memory cells are biased with lower voltages than a selected memory cell, the leakages during the lengthy write durations add up and cause the resistances in some or all of the unselected or half-selected memory cells in the array to drift. Simulations were performed on a computer using a circuit model of the memory structure 10 to quantify this drift in which consecutive write operations were performed on every memory cell 14 in the array 12 of the model of the memory structure 10. The resulting resistance distributions are shown in FIGS. 15A-15C. The distributions include the effects of write operations performed on neighboring memory cells and the parasitic crossbar resistances, and these values change depending on the location of the selected memory cell 14 within the array 12. The variations from the nominal value are within the margins that can be obtainable with the reduced-impact read scheme described above (i.e., wherein the read biasing voltage is reduced related to the write biasing voltage, and the series resistance of the read circuitry is increased relative the value when a write operation is performed). Based on the simulation results, it can be concluded that it is possible to write or program the entire array, and then read the resistance values of the memory cells using the described read scheme while allowing margin or tolerance for additional drift that can be caused by repeated read operations.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A resistive memory structure, comprising:
   a resistive memory element;
   a resistance block configured to be electrically connected in series with the resistive memory element through an electrical node therebetween; and
   an interpretation circuit configured to be electrically connected to the electrical node and configured to interpret a voltage at the electrical node and to indicate a resistive state of the resistive memory element based on the voltage at the electrical node, the interpretation circuit comprising:
      one or more active devices each having an input and an output;
      one or more passive devices each electrically connected to the output of a respective one of the one or more active devices; and
      one or more comparators each electrically connected to the output of a respective one of the one or more active devices,
   wherein each of the one or more active devices and the passive device electrically connected thereto are configured to provide a voltage level to the respective one of the one or more comparators to which the active device is electrically connected, the voltage level(s) provided to the comparator(s) being derived from the voltage at the electrical node, and further wherein the one or more comparators are configured to indicate the resistive state of the memory element based on the provided voltage level(s).

2. The resistive memory structure of claim 1, wherein the one or more active devices comprise one or more diodes.

3. The resistive memory structure of claim 1, wherein the one or more passive devices comprise one or more resistors.

4. The resistive memory structure of claim 1, wherein at least two of the one or more comparators are configured to compare the voltage level provided thereto with the same reference voltage.

5. The resistive memory structure of claim 4, wherein the reference voltage is a selection voltage applied to the resistive memory element during the performance of a read or write operation performed on the resistive memory element.

6. The resistive memory structure of claim 1, wherein the resistance block is a variable resistance block such that the resistance thereof can be changed.

7. A resistive memory structure, comprising:
   a resistive memory element;
   a resistance block configured to be electrically connected in series with the resistive memory element through an electrical node therebetween; and
   an interpretation circuit configured to be electrically connected to the electrical node and configured to interpret a voltage at the electrical node and to indicate a resistive state of the resistive memory element based on the voltage at the electrical node, the interpretation circuit comprising:
      one or more active devices each having an input and an output;
      one or more passive devices each electrically connected to the output of a respective one of the one or more active devices; and
      one or more comparators each electrically connected to the output of a respective one of the one or more active devices,
   wherein each of the one or more active devices and the passive device electrically connected thereto are configured to provide a voltage level to the respective one of the one or more comparators to which the active device is electrically connected, the voltage level(s) provided to the comparator(s) being derived from the voltage at the electrical node, and further wherein the one or more comparators are configured to indicate the resistive state of the memory element based on the provided voltage level(s);
   wherein the resistive memory element is one of a plurality of resistive memory elements in an array arranged in a one or more columns and one or more rows, and the resistive memory element is contained in a particular column and a particular row of the array, the resistive memory structure further including a controller configured to control the application voltages to the columns and rows of the array, wherein during a read or write operation performed on the resistive memory element, the controller is configured to cause:
   a first voltage to be applied to the row of the array in which the resistive memory element is contained;
   a second voltage different than the first voltage to be applied to the column(s) of the array that do not contain the resistive memory element;
   a third voltage different than both the first and second voltages to be applied to the row(s) of the array that do not contain the resistive memory element; and
   a fourth voltage different than the first, second, and third voltages to be applied to the column of the array in which the resistive memory element is contained.

8. The resistive memory structure of claim 7, wherein:
   the first voltage is greater than the second, third, and fourth voltages;
   the second voltage is less than the first voltage and greater than the third and fourth voltages;
   the third voltage is less than the first and second voltages and greater than the fourth voltage; and
   the fourth voltage is less than the first, second, and third voltages.

9. A circuit for use in performing read or write operations on a resistive memory element, comprising:
   an electrical node configured for electrical connection to the resistive memory element;
   a resistance block configured to be electrically connected to the electrical node; and
   an interpretation circuit configured to be electrically connected to the electrical node, to interpret a voltage at the electrical node, and to indicate a resistive state of the resistive memory element based on the voltage at the electrical node, the interpretation circuit comprising:
      one or more active devices each having an input and an output;

one or more passive devices each electrically connected to the output of a respective one of the one or more active devices; and one or more comparators each electrically connected to the output of a respective one of the one or more active devices, wherein each of the one or more active devices and the passive device electrically connected thereto are configured to provide a voltage level to the respective one of the one or more comparators to which the active device is electrically connected, the voltage level(s) provided to the comparator(s) being derived from the voltage at the electrical node, and further wherein the one or more comparators are configured to indicate the resistive state of the memory element based on the provided voltage level(s).

10. The circuit of claim 9, wherein the one or more active devices comprise one or more diodes.

11. The circuit of claim 9, wherein the one or more passive devices comprise one or more resistors.

12. The circuit of claim 9, wherein two or more of the one or more comparators are configured to compare the voltage levels provided thereto with the same reference voltage.

13. The circuit of claim 12, wherein the reference voltage is a selection voltage applied to the resistive memory element during the performance of a read or write operation performed on the resistive memory element.

14. The circuit of claim 9, wherein the resistance block is a variable resistance block such that the resistance thereof can be changed.

15. The resistive memory structure of claim 1, wherein the resistive memory element comprises a memory cell configured to store more than one bit of data.

* * * * *